(12) United States Patent
Yarino et al.

(10) Patent No.: US 10,048,380 B2
(45) Date of Patent: Aug. 14, 2018

(54) DISTANCE-MEASURING IMAGING DEVICE AND SOLID STATE IMAGING ELEMENT

(71) Applicant: Panasonic Intellectual Property Management Co., Ltd., Osaka (JP)

(72) Inventors: Makoto Yarino, Kyoto (JP); Toshiya Fujii, Shiga (JP); Mitsuhiko Otani, Hyogo (JP); Haruka Takano, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 459 days.

(21) Appl. No.: 14/973,002

(22) Filed: Dec. 17, 2015

(65) Prior Publication Data
US 2016/0103223 A1 Apr. 14, 2016

Related U.S. Application Data

(63) Continuation of application No. PCT/JP2013/006123, filed on Oct. 15, 2013.

(30) Foreign Application Priority Data

Jun. 27, 2013 (JP) .................................. 2013-135488

(51) Int. Cl.
*G01S 17/89* (2006.01)
*G01S 7/486* (2006.01)
(Continued)

(52) U.S. Cl.
CPC ............ *G01S 17/89* (2013.01); *G01S 7/4863* (2013.01); *G01S 17/36* (2013.01);
(Continued)

(58) Field of Classification Search
CPC ............ G01S 7/4863; H01L 27/14843; H04N 5/3728
See application file for complete search history.

(56) References Cited

U.S. PATENT DOCUMENTS 6,778,219 B1 8/2004 Seo et al.
2005/0220450 A1* 10/2005 Enomoto ................ G01S 17/08
396/104

(Continued)

FOREIGN PATENT DOCUMENTS

JP 59-169279 9/1984
JP 2000-138367 5/2000
(Continued)

*Primary Examiner* — Eric L Bolda
(74) *Attorney, Agent, or Firm* — Wenderoth, Lind & Ponack, L.L.P.

(57) ABSTRACT

A distance-measuring imaging device includes: a drive control unit; a light source unit; an image processing unit including light receiving units and charge reading units arranged one-to-one; and an image processing unit. The charge reading units are arranged partly at the left side of corresponding ones of the light receiving units and partly at the right side of corresponding ones of the same. In each of a period in which the exposure is performed when the exposure control signal is received after a first delay time since when the light emission control signal is received and a period in which the exposure is performed when the exposure control signal is received after a second delay time longer than the first delay time, since when the light emission control signal is received, the left-side charge reading units read charge leftward, and the right-side charge reading units read charge rightward.

9 Claims, 24 Drawing Sheets

(51) Int. Cl.
*H01L 27/148* (2006.01)
*H04N 5/3728* (2011.01)
*G01S 17/36* (2006.01)
*G01S 17/10* (2006.01)

(52) U.S. Cl.
CPC ........ *H01L 27/14843* (2013.01); *G01S 17/10* (2013.01); *H04N 5/3728* (2013.01)

(56) References Cited

U.S. PATENT DOCUMENTS

| | | | | |
|---|---|---|---|---|
| 2006/0114333 | A1* | 6/2006 | Gokturk | G01S 7/487 348/222.1 |
| 2006/0176469 | A1* | 8/2006 | O'Connor | G01C 3/08 356/5.11 |
| 2016/0073088 | A1* | 3/2016 | Cohen | H04N 13/0207 348/46 |
| 2016/0097841 | A1* | 4/2016 | Otani | G01C 3/08 356/5.03 |
| 2016/0097844 | A1* | 4/2016 | Takano | G01S 17/89 356/5.01 |

FOREIGN PATENT DOCUMENTS

| | | |
|---|---|---|
| JP | 2000-184385 | 6/2000 |
| JP | 2001-153624 | 6/2001 |
| JP | 2012-4264 | 1/2012 |
| JP | 2012-215480 | 11/2012 |

* cited by examiner

DISTANCE-MEASURING IMAGING DEVICE AND SOLID STATE IMAGING ELEMENT

CROSS REFERENCE TO RELATED APPLICATIONS

This is a continuation application of PCT International Application No. PCT/JP2013/006123 filed on Oct. 15, 2013, designating the United States of America, which is based on and claims priority of Japanese Patent Application No. 2013-135488 filed on Jun. 27, 2013. The entire disclosures of the above-identified applications, including the specifications, drawings and claims are incorporated herein by reference in their entirety.

FIELD

One non-limiting and exemplary embodiment provides a distance-measuring device and a solid state imaging element.

BACKGROUND

A time of flight (TOF) method for measuring a distance based on flight time in which light travels to and from an object, using a solid state imaging element (image sensor) is known among a plurality of methods for detecting an object.

FIG. 24 is a plan view illustrating a part of a unit pixel 900 of a solid state imaging element that uses the TOF method. The unit pixel 900 is a conventional art disclosed in Patent Literature 1. The unit pixel 900 includes a plurality of light receiving devices 100. In this embodiment, the unit pixel 900 includes four light receiving devices 100 arranged in a matrix.

The unit pixel 900 includes the four light receiving devices 100 arranged in the matrix. The light receiving devices 100 includes: a photoelectric conversion element 104 formed above a semiconductor substrate; four photoelectron distributing units 106; and two photoelectron discharging unit 108. The photoelectric conversion element 104 has a photo gate structure with electrodes formed above the semiconductor substrate through an insulator. The photoelectric conversion element 104 is a photodiode that detects light, and generates photoelectron (negative charge), that is, converts the detected light into photoelectrons. A gate drive signal for driving the photoelectric conversion element 104 is input to a photo gate from the gate drive circuit. In addition, the photoelectron distributing unit 106 includes: a first transfer unit 112; a photoelectron holding unit 114; a second transfer unit 116; and a floating diffusion layer 118. The first transfer unit 112 transfers the photoelectron generated by the photoelectric conversion element 104 to the photoelectron holding unit 114.

CITATION LIST

Patent Literature

PTL 1
Japanese Unexamined Patent Application Publication No. 2012-215480

SUMMARY

Technical Problem

However, the conventional art disclosed in Patent Literature 1 allows leak-in of diagonally incident light by the photoelectron distributing unit. In addition, signal charge in four-kind light receiving signal periods at different timings are read out from the photoelectron distributing unit.

For this reason, Patent Literature 1 entails problems that: light receiving signal periods that are affected by such leak-in of light vary; and a measurement precision is reduced such that measured distances are larger than actual distances in one of the right and left sides of a light receiving surface (imaging area) and smaller than actual distances in the other one of the sides.

In view of the above problems, one non-limiting and exemplary embodiment provides a distance-measuring imaging device and a solid state imaging element which reduce a measurement variation in an imaging area of the solid state imaging element and achieves high distance measurement precision.

Solution to Problem

The distance-measuring imaging device according to an aspect of the present invention includes: a drive control unit configured to generate a light emission control signal instructing light emission and an exposure control signal instructing exposure; a light source unit configured to perform the light emission upon receiving the light emission control signal; an imaging unit configured to obtain imaging information by performing, upon receiving the exposure control signal, the exposure to light reflected from a target object in response to the light emission; and an image processing unit configured to output distance information using the imaging information, the distance information indicating a distance to the target object, wherein the imaging unit includes: a plurality of light receiving units configured to generate charge by the exposure; and a plurality of charge reading units arranged one-to-one with the plurality of light receiving units, and configured to read the charge generated by the plurality of light receiving units, a part of the plurality of charge reading units being arranged at a left side of corresponding ones of the plurality of light receiving units, a remaining part of the plurality of charge reading units being arranged at a right side of corresponding ones of the plurality of light receiving units, and wherein in each of (i) a first exposure period in which the exposure is performed when the exposure control signal is received after a lapse of a first delay time, since a time when the light emission control signal is received by the light source unit and (ii) a second exposure period in which the exposure is performed when the exposure control signal is received after a lapse of a second delay time longer than the first delay time, since a time when the light emission control signal is received by the light source unit, the part of the plurality of charge reading units are configured to read charge leftward, the charge being generated by the corresponding ones of the plurality of light receiving units, and the remaining part of the plurality of charge reading units read charge rightward, the charge being generated by the corresponding ones of the plurality of light receiving units.

With this configuration in which the part of the plurality of charge reading units are arranged at the left side of the corresponding light receiving units and the remaining part are arranged to the right side of the corresponding light receiving units, it is possible to reduce the variation of the distance information (such as distance signals) in the imaging area. Thus, it is possible to achieve high distance measurement precision.

For example, the image processing unit may include: a shading component detecting unit configured to detect, for each of segments of an imaging area and using the imaging information, a shading component which is a variation of the distance information in the imaging area including the plurality of light receiving units and the plurality of charge reading units in the imaging unit; a lookup table for storing the shading component for each of the segments detected by the shading component detecting unit; and a correcting unit configured to correct the imaging area shading of the distance information, based on the shading component for each of the segments stored in the lookup table.

In this way, the imaging area shading of distance information is corrected, which enables highly precise distance measurement.

An aspect of the present invention can be implemented not only as the distance-measuring imaging device, but also as a solid state imaging element for use in the distance-measuring imaging device.

The solid state imaging device according to an aspect of the present invention is a solid state imaging element for use in a distance-measuring imaging device, the distance-measuring imaging device including: a drive control unit configured to generate a light emission control signal instructing light emission and an exposure control signal instructing exposure; a light source unit configured to perform the light emission upon receiving the light emission control signal; an image processing unit configured to output distance information using the imaging information obtained by the solid state imaging element, the distance information indicating a distance to a target object, the solid state imaging device: obtaining the imaging information by performing, upon receiving the exposure control signal, the exposure to light reflected from a target object in response to the light emission; and including: a plurality of light receiving units configured to generate charge by the exposure; and a plurality of charge reading units arranged one-to-one with the plurality of light receiving units, and configured to read the charge generated by the plurality of light receiving units, a part of the plurality of charge reading units being arranged at a left side of corresponding ones of the plurality of light receiving units, a remaining part of the plurality of charge reading units being arranged at a right side of corresponding ones of the plurality of light receiving units, and wherein in each of (i) a first exposure period in which the exposure is performed when the exposure control signal is received after a lapse of a first delay time since a time when the light emission control signal is received by the light source unit and (ii) a second exposure period in which the exposure is performed when the exposure control signal is received after a lapse of a second delay time longer than the first delay time, since a time when the light emission control signal is received by the light source unit, the part of the plurality of charge reading units are configured to read charge leftward, the charge being generated by the corresponding ones of the plurality of light receiving units, and the remaining part of the plurality of charge reading units read charge rightward, the charge being generated by the corresponding ones of the plurality of light receiving units.

For example, the imaging unit (the solid state imaging element) may further include a plurality of bonding pads, and the plurality of bonding pads are for receiving the exposure control signal and are arranged at least at positions opposite to each other above and below an imaging area, the imaging area including the plurality of light receiving units and the plurality of charge reading units.

In this way, the plurality of boding pads which receive an exposure control signal that instructs exposure are arranged at least at positions opposite to each other above and below the imaging area, and thus it is possible to reduce the variation in the amount of exposure in either the vertical direction or the vertical and horizontal directions on the surface of the imaging area. As a result, it is possible to achieve further higher measurement precision.

For example, the solid state imaging element may be a solid state imaging element that is a charge coupled device (CCD), and the exposure control signal may include a substrate voltage for causing the charge in the plurality of light receiving units to overflow.

This makes it possible to perform what is called a global reset that is an operation of resetting the plurality of light receiving units collectively, thereby achieving further higher distance measurement precision.

In addition, the solid state imaging element according to an aspect of the present invention is a solid state imaging element for use in a distance-measuring device, the solid state imaging element including: a plurality of light receiving units provided on a semiconductor substrate and configured to generate charge through exposure; a plurality of charge reading units arranged one-to-one with the plurality of light receiving units and configured to read the charge generated by the plurality of light receiving units; and a plurality of bonding pads for receiving an exposure control signal instructing the exposure of the plurality of light receiving units, wherein a part of the plurality of charge reading units are arranged at left sides of corresponding ones of the light receiving units, and configured to read charge generated by the corresponding ones of the light receiving units leftward, a remaining part of the plurality of charge reading units are arranged at right sides of corresponding ones of the light receiving units and configured to read charge generated by the corresponding ones of the light receiving units rightward, and the plurality of bonding pads are arranged at least at positions opposite to each other above and below the imaging area, the imaging area including the plurality of light receiving units and the plurality of charge reading units.

For example, the plurality of light receiving units may be arranged in a matrix, and the part of the light receiving units whose charge is read leftward and the remaining part of the light receiving units whose charge is read rightward may be arranged alternately in a column direction and in a row direction.

In this way, it is possible to further reduce the variation of the distance information in the imaging area.

For example, the solid state imaging element may be a solid state imaging element that is a charge coupled device (CCD), and the exposure control signal may include a substrate voltage for causing the charge in the plurality of light receiving units to overflow.

For example, in the solid state imaging element, the plurality of light receiving units may be arranged in a matrix, and odd-line light receiving elements and even-line light receiving elements among the plurality of light receiving units may have different exposure times and different reading times.

Advantageous Effects

The device and element according to one or more exemplary embodiments or features disclosed herein reduce a variation of distance information in the imaging area in the solid state imaging element, and enables achievement of high measurement precision.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Hereinafter, the distance-measuring imaging device according to embodiments disclosed herein is described with reference to the drawings. It is to be noted that the embodiments below indicate specific examples of the present disclosure, and thus the numerical values, shapes, materials, constituent elements, the arrangement and connection of the constituent elements are mere examples, and therefore do not limit the scope of the present disclosure.

Embodiment 1

[Distance-Measuring Imaging Device]

Figure 1:
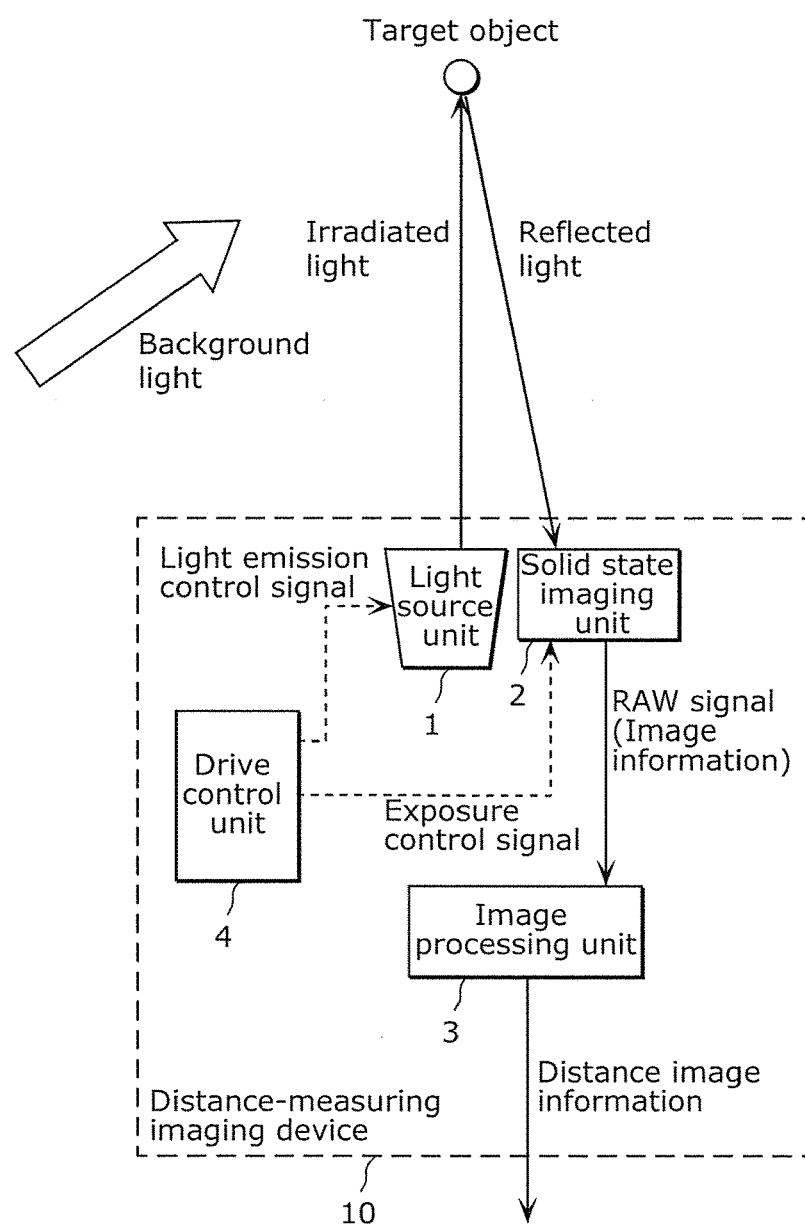
FIG. 1 is a functional block diagram illustrating a schematic configuration of a distance-measuring imaging device including a solid state imaging unit according to Embodiment 1.

FIG. 1 is a functional block diagram illustrating a schematic configuration of a distance-measuring imaging device according to Embodiment 1.

As illustrated in the diagram, the distance-measuring imaging device 10 includes: a light source unit 1; a solid state imaging unit 2; an image processing unit 3; and a drive control unit 4.

The light source unit 1 receives a light emission control signal generated by the drive control unit 4, and irradiates (emits) light (for example, infrared light) according to a timing specified by a light emission control signal. The light source unit 1 includes a drive circuit, a capacitor, and a light emission element, and emits light by supplying charge held in the capacitor to the light emission element. A laser diode, a light emission diode (LED), or the like may be used as the light emission element.

The solid state imaging unit 2 (imaging unit) obtains RAW data (imaging information) from a total sum of the amounts of light in the exposure performed several times by performing exposure according to timings specified by exposure control signals generated by the drive control unit 4. More specifically, the solid state imaging unit 2 obtains the RAW data by performing, upon receiving the exposure control signals generated by the drive control unit 4, the exposure to light reflected from a target object when light is irradiated by the light source unit 1. The solid state imaging unit 2 includes: a camera lens; a solid state imaging element; an A/D converter; a circuit for generating and outputting the RAW data, etc.

The drive control unit 4 generates a light emission control signal for specifying irradiation (emission) of light and an exposure control signal for specifying exposure, and specifies a timing for irradiation by the light source unit 1 and a timing for exposure by the solid state imaging unit 2.

The image processing unit 3 outputs distance image information (distance information) indicating a distance to the target object using the RAW data received from the solid state imaging unit 2.

[General Solid State Imaging Element]

Figure 2:
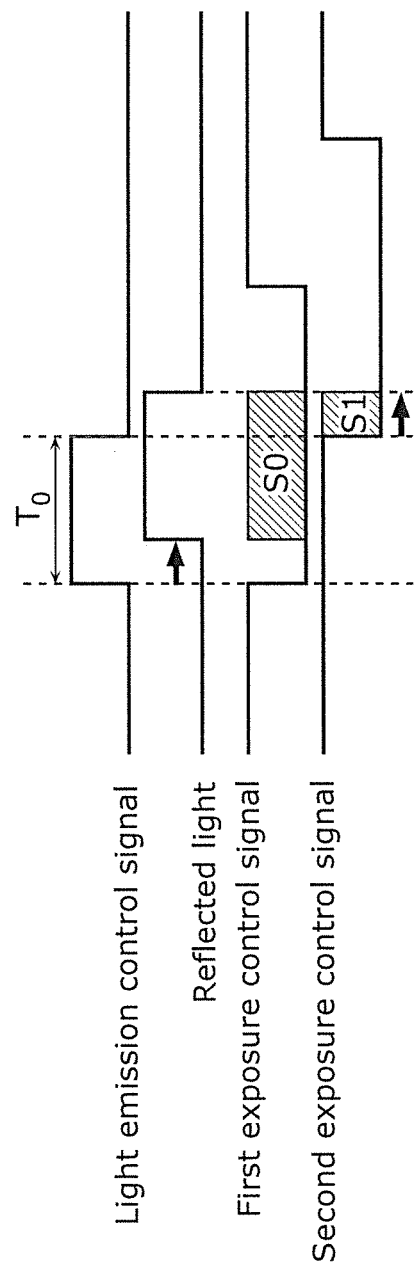
FIG. 2 is a diagram illustrating timings for detecting the amounts of light in exposure in a general distance-measuring imaging device.
Figure 3:
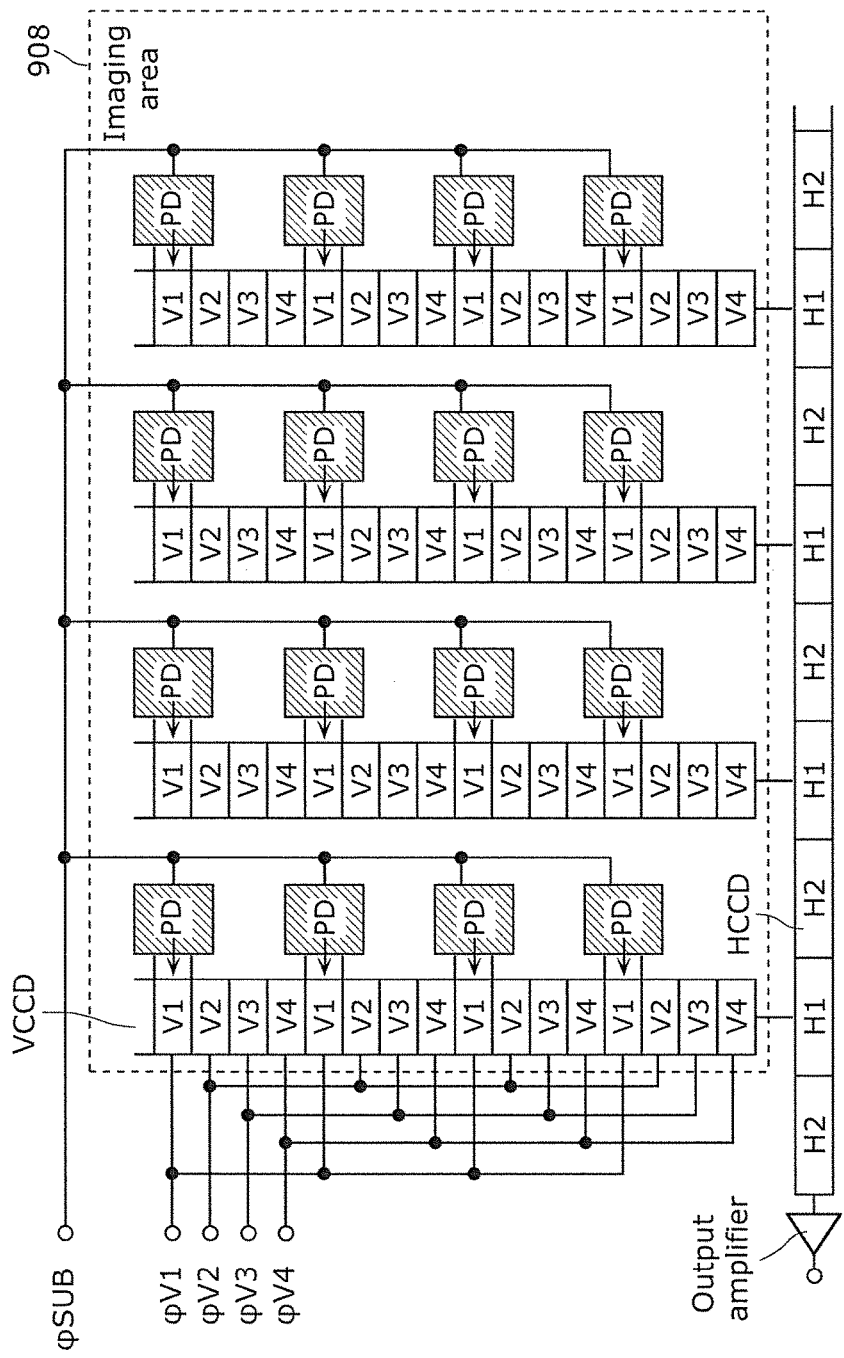
FIG. 3 is a layout diagram illustrating a configuration of a general CCD solid state imaging element.

Here, a solid state imaging element mounted on a general distance-measuring imaging device is described with reference to FIGS. 2 and 3. FIG. 2 is a diagram illustrating timings for detecting the amounts of light in exposure in the general distance-measuring imaging device. FIG. 3 is a layout diagram illustrating a configuration of a solid state imaging element that is a charge coupled device (CCD).

As illustrated in FIG. 2, in the case of measuring a distance to a target object using a TOF method, the following method is generally used: to calculate a distance to the measurement target based on a ratio of the amounts of light obtained through exposure to light reflected from the measurement target, in two patterns at different timings For example, the distance-measuring imaging device performs exposure such that all of the light reflected from the target object is included in an exposure period, and that the amount of light in exposure increases as the light reflected from the measurement target delays with respect to a light emission time by a second exposure control signal. In addition, in order to detect an offset component for the amount of light in exposure by background light etc., the distance-measuring imaging device stops the light emission control signal, and performs exposure under the same condition as specified by the second exposure control unit.

Here, a distance L can be calculated by performing calculation according to Expression 1 below where a total sum of the amounts of exposure according to first exposure control signals is S0, a total sum of the amounts of exposure according to second exposure control signals is S1, a total sum of the amounts of exposure of background light is BG, the width of light emission signal of direct light to be irradiated is T0, and light speed (299, 792, 458 m/s) is c. It is to be noted that the amount of light according to a first exposure control signal is the amount of light generated through exposure performed according to the first exposure control signal, and the amount of light according to a second exposure control signal is the amount of light generated through exposure performed according to the second exposure control signal.

[Math. 1]

$$L = \frac{c \cdot T_0}{2} \times \left( \frac{S1 - BG}{S0 - BG} \right) \qquad \text{Expression 1}$$

Here, as illustrated in FIG. 3, the general CCD solid state imaging element includes pairs of light receiving units (photodiodes, or PDs) arranged in columns and vertical transfer units (VCCDs hereinafter) arranged in columns. For the PDs, charge reading units (reading gates) for reading charge from the PDs to the VCCDs are all arranged in the same one of right and left directions. Accordingly, the general CCD solid state imaging element does not have a structure having a geometric right-left symmetry as is clear from the positional relationship between the PDs and VCCDs. Distance-measuring devices mounting a general CCD solid state imaging element without such geometric right-left symmetry have problems below.

For example, as illustrated in FIG. 3, when reading gates are arranged at only the left side of the PDs, light incident from the left side (the direction in which reading by the reading gates is performed) in the drawing sheet does not leak into the VCCDs, but light incident from the right side of the drawing sheet leaks into the VCCDs. As such, even when the amounts of light incident to the imaging area 908 are equal to each other, the amount of light in exposure to the light incident from the right side in the drawing sheet is larger than the amount of light, in exposure, incident from the left side in the drawing sheet.

Here, a total sum (S0) of the amounts of light exposed according to first exposure control signals in an exposure period in which all of light reflected from a target object is included in the exposure period is always larger than a total sum (S1) of the amounts of light exposed according to second exposure control signals for specifying exposure in which the amount of light increases as the light reflected from the measurement target delays with respect to a light emission time. Thus, even when the amounts of light leaked into the VCCDs in exposure periods according to the first exposure control signals and the amounts of light leaked into the VCCDs in exposure periods according to the second exposure control signals are equal to each other, the rates of the amounts of charge generated due to the leak-in of light exposed according to the second exposure control signals are larger relative to the amounts of light in the respective exposure periods. In other words, the S1 that is the total sum of the amounts of light in exposure according to the second exposure control signals has a larger influence ratio. As a result, a measured distance is larger than an actual distance to the target object.

Accordingly, as a position in the imaging area of the solid state imaging element becomes closer to the left side, the angle of light incidence from the right side increases and the amount of leak-in of light to the VCCDs increases. Thus, the ratio of S1 that is the total sum of the amounts of light in exposure according to the second exposure control signals increases with respect to S0 that is the total sum of the amounts of light in exposure according to the first exposure control signals. As a result, as is known from Expression 1, the measured distance is larger than the actual distance to the target object.

A configuration in which photoelectron distributing units are formed to the right and left of corresponding PDs is also conceivable. In such a configuration, light entered diagonally leaks into the VCCDs, which causes property deterioration stemming from shading components in distance images. Furthermore, signal charge generated in a plurality of light receiving signal periods at different timings are read out to the photoelectron distributing units, light receiving signal periods affected by leak-in of light vary among the right and left sides of the light receiving surface in the solid state imaging element. As a result, a distance measured in one of the right and left sides of the light receiving surface in the solid state imaging element is larger than the actual distance to the target object, and a distance measured in the other is smaller than the actual distance to the measurement target.

In addition, when a pixel drive circuit for controlling exposure of the solid state imaging element is arranged along a side (one of the four sides corresponding to the periphery of the imaging area 908) in a surrounding area of the imaging area 908, a PD (pixel) arranged at a position farther from the pixel drive circuit has a larger delay of each of the first and second exposure control signals with respect to a light emission signal. Thus, a PD arranged at a position closer to the pixel drive circuit and a PD arranged at a position farther from the pixel drive circuit receive light in exposure at different timings. As a result, the amounts of light in exposure vary, producing a variation of measured distances.

In view of this, the solid state imaging element according to this embodiment can reduce the above-described property deterioration. This is described in detail below.

[Solid State Imaging Element According to this Embodiment]

Figure 4:
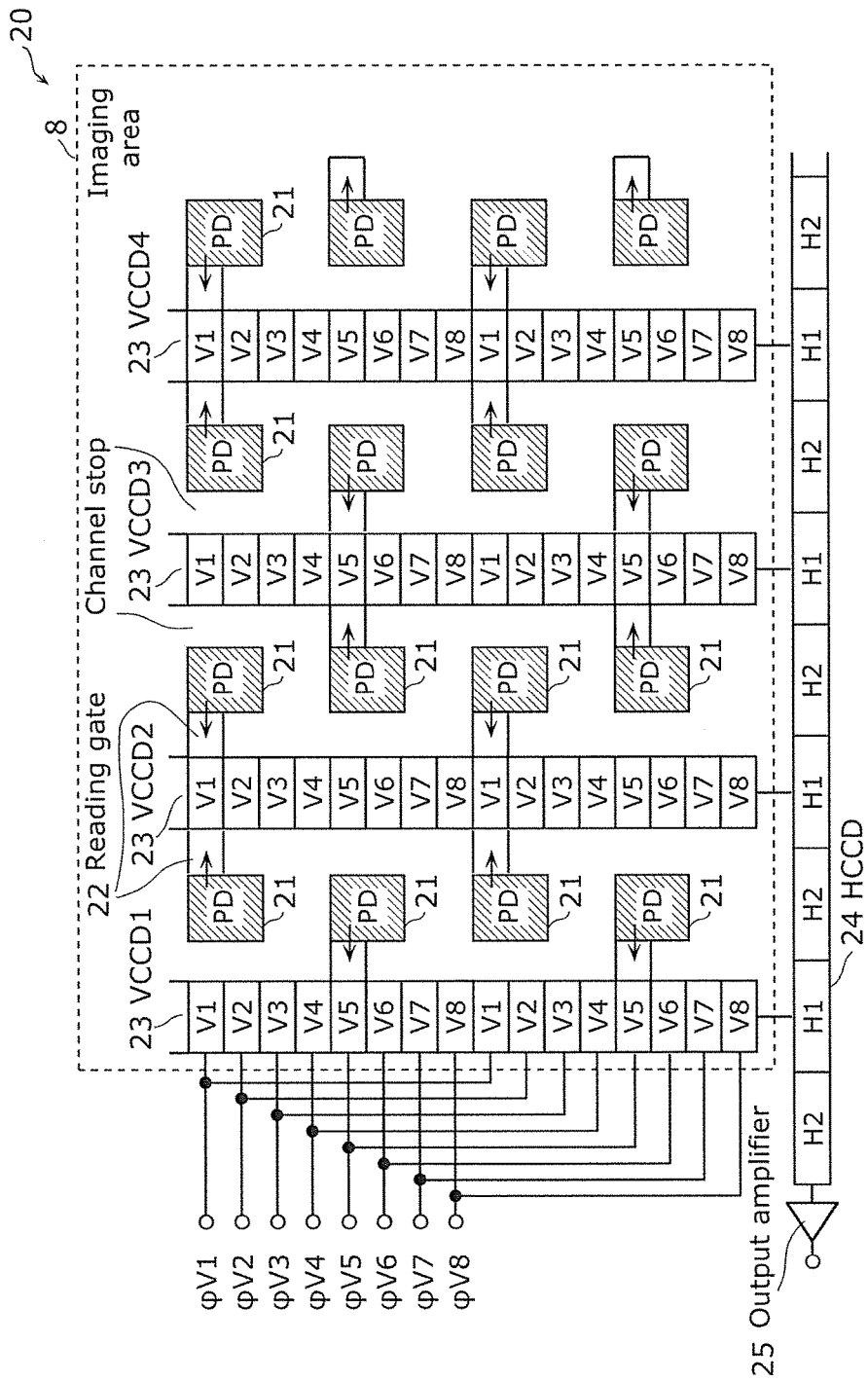
FIG. 4 is a configuration diagram illustrating an example of a solid state imaging element according to Embodiment 1.

FIG. 4 is a configuration diagram illustrating an example of a solid state imaging element according to this embodiment. A solid state imaging unit 2 of the distance-measuring device 10 includes a solid state imaging element 20. Here, four pixels in a vertical direction and four pixels in a horizontal direction are simply illustrated to facilitate understanding of the present disclosure.

As illustrated in FIG. 4, the solid state imaging element 20 according to this embodiment includes: a plurality of PDs 21 (a plurality of light receiving units); a plurality of reading gates 22 (a plurality of charge reading units); a plurality of VCCDs 23 (a plurality of vertical transfer units); an HCCD 24 (a horizontal transfer unit); and an output amplifier 25.

The plurality of PDs 21 are photodiodes arranged in a matrix on a semiconductor substrate, and each of which is configured to convert incident light to signal charge.

The plurality of reading gates 22 each are provided for a corresponding one of the PDs 21, and read signal charge from the corresponding PDs 21.

Each of the plurality of VCCDs 23 includes a plurality of gates, and transfers signal charge read from the corresponding PDs 21 by the plurality of reading gates 22 sequentially in the vertical direction. For example, each of the VCCDs 23 includes eight phase electrodes V1 to V8 (which may be referred to as gates V1 to V8 hereinafter) for transferring signal charge read from the corresponding PDs 21 in the column direction (vertical direction).

Each of the HCCD 24 includes a plurality of gates, and transfers signal charge transferred from the plurality of VCCDs 23 sequentially in the horizontal direction (row direction). For example, this HCCD 24 includes two phase electrodes H1 and H2.

The output amplifier 25 sequentially detects signal charge transferred from the HCCD 24, converts the signal charge to voltage signals, and outputs the voltage signals.

Here, among the gates V1 to V8 of each of the VCCDs 23, the gates V1 and V5 are shared with the reading gate 22 provided for a corresponding one of the PDs 21 so as to read signal charge on a per row and column basis. In addition, channel stops for preventing or reducing mix-in of signal charge are provided at both sides in the right-left direction, specifically, at a side at which the reading gates 22 for the PDs 21 are formed and the opposite side.

In this way, the solid state imaging element 20 according to this embodiment is a CCD solid state imaging element (CCD image sensor).

With this configuration, a plurality of packets which have already been included in the VCCDs 23 can be used as means for accumulating signals obtainable in different exposure periods in which exposure control signals for receiving light reflected from the target object are generated at different timings correspondingly to light emission control signals, without the need to form signal accumulating means additionally. Therefore, it is possible to implement such a compact distance-measuring imaging device capable of measuring a distance with high precision.

In other words, as illustrated in FIG. 4, the solid state imaging element 20 and the distance-measuring imaging device mounting the solid state imaging element 20 both according to this embodiment are unique in having the PDs 21 arranged right and left in a geometrically symmetric layout with respect to the reading gates 22. More specifically, VCCDs 23 arranged in even columns (VCCD 2 and VCCD 4 in the diagram) are provided with a reading gate V1 that is shared by the corresponding PDs 21 arranged to the right and left of the reading gate V1 and that performs reading in vertical transfer from the corresponding PDs 21, and VCCDs 23 arranged in odd columns (VCCD 1 and VCCD 3 in the diagram) is provided with a reading gate V5 that is shared by the corresponding PDs 21 arranged to the right and left of the reading gate V5 and that performs reading in vertical transfer from the corresponding PDs 21. In other words, signal charge of the two horizontally adjacent PDs 21s is added in each of the packets of the gates V1 of VCCDs 23 in even columns and each of the packets of the gates V5 of VCCDs 23 in odd columns, and the signal charge is read by the reading gate V1 or V5 of the corresponding ones of the VCCDs 23. As a result, in the VCCDs 23, it is possible to read the signal charge in a staggered shape.

In this way, the solid state imaging element 20 according to this embodiment includes: the plurality of PDs 21 (light receiving units) which generate signal charge (charge) through exposure; and the plurality of reading gates 22 (charge reading units) which are arranged one-to-one with the plurality of PDs 21, and read the signal charge generated by the plurality of PDs 21. A part of the plurality of reading gates 22 are arranged at the left side of corresponding ones of the PDs 21, and read signal charge generated by the corresponding PDs 21 leftward, and the remaining part of the plurality of reading gates 22 are arranged at the right side of corresponding ones of the PDs 21, and read signal charge generated by the corresponding PDs 21 rightward.

In this way, it is possible to reduce a variation of distance information in the imaging area 8 (light receiving surface). More specifically, each of the VCCDs 23 and the corresponding PDs 21 have a geometric right-left symmetry, and thus can reduce a difference in the amount of light that leaks-in the VCCD 23 and reduce a variation of distance information in the imaging area 8 (light receiving surface). In other words, the distance-measuring imaging device 10 including the solid state imaging element 20 according to this embodiment is capable of measuring a distance with high precision, compared to a distance-measuring imaging device using a conventional solid state imaging element in which all of reading gates are arranged at the same side (left side) of the PDs.

In addition, the PDs 21 whose signal charge is read leftward and the PDs 21 whose signal charge is read rightward are arranged alternately in the column and row directions. In this way, it is possible to further reduce a measurement variation in the imaging area 8.

Figure 5:
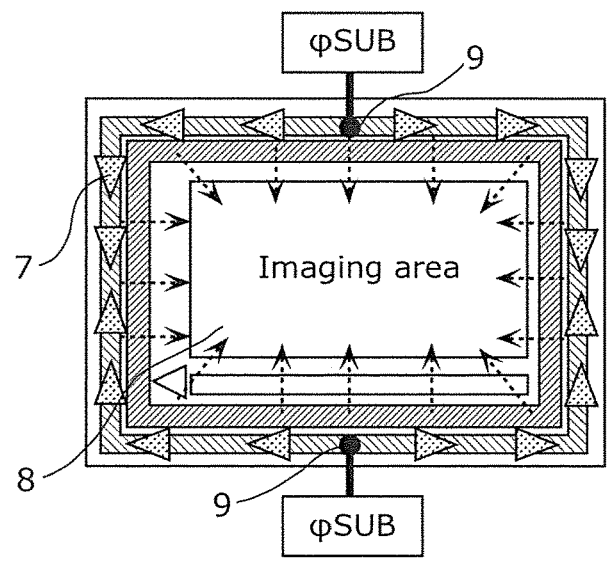
FIG. 5 is a layout diagram illustrating an example of a configuration of a surrounding area of an imaging area.
Figure 6:
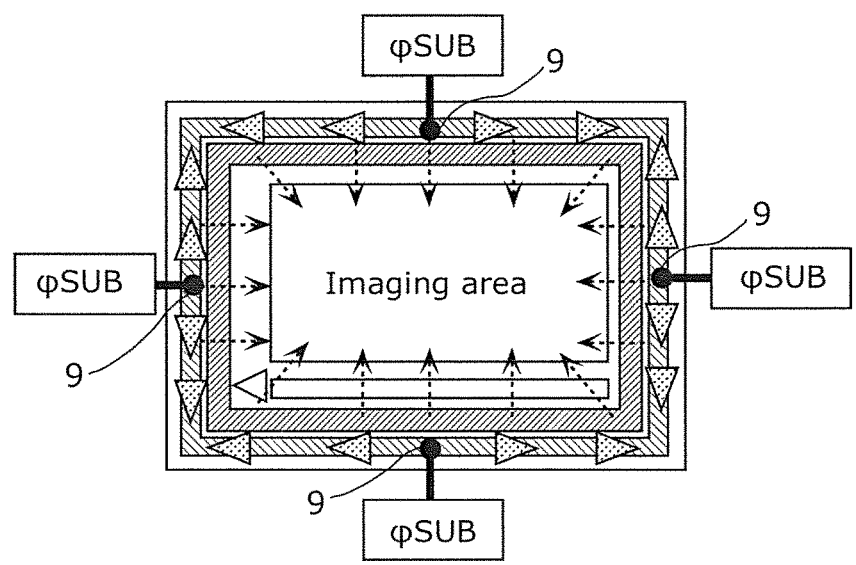
FIG. 6 is a layout diagram illustrating another example of a configuration of a surrounding area of an imaging area.

Next, a configuration of the surrounding part of the imaging area of the solid state imaging element 20 according to this embodiment is described in detail with reference to FIGS. 5 and 6. FIG. 5 is a layout diagram illustrating an example of a configuration of the surrounding part of the imaging area. FIG. 6 is a layout diagram illustrating another example of a configuration of the surrounding part of the imaging area. Each of these diagrams illustrates in detail (i) a bonding pad for supplying a substrate voltage (SUB) to be given to each of the PDs 21 of all pixels so that signal charge accumulated in the PD 21 is caused to overflow, and (ii) a drain (vertical overflow drain (VOFD)) for vertical charge overflow.

The VOFDs are configured in a bulk direction (the depth direction of the semiconductor substrate) of the PDs 21. When a high voltage is applied to a SUB terminal, signal charge of all of the PDs 21 are collectively drained outside via the SUB terminal. More specifically, (i) when the SUB terminal is at High level, signal charge in the PDs 21 are drained (outside) to the semiconductor substrate, and (ii) when the SUB terminal is at Low level and pulses φV1 and φV5 each of which is applied to a corresponding one of the electrodes V1 and V5 are at High level, signal charge photo-electrically converted in the PDs 21 are accumulated below the electrodes V1 and V5.

In addition, in a state where the reading gate 22 is open, a substrate voltage (SUB) is controlled according to a pulse φSUB that is applied to the SUB terminal, and exposure is performed in a period in which the φSUB is Low, and accumulates signal charge in the VCCD 23. In other words, the pulse φSUB is an exposure control signal specifying an exposure timing.

Here, as illustrated in FIG. 5, a plurality of bonding pads 9 for receiving the pulse φSUB which are the exposure control signals are arranged above and below the imaging area 8. As an example, in FIG. 5, the plurality of bonding pads 9 for receiving the exposure control signal specifying the exposure on the plurality of PDs 21 are arranged above and below the imaging area 8 including the plurality of PDs 21 and the plurality of reading gates 22. At this time, the pulse φSUB applied to the bonding pads 9 propagates as illustrated in a φSUB pulse propagation image in FIG. 7.

In this way, in the vertical direction in the imaging area 8 including the plurality of PDs 21, a propagation differential delay of the pulse φSUB that is the exposure control signal is cancelled. Thus, it is possible to reduce vertical variation of the amounts of exposure in the surface of the imaging area 8, and to perform highly precise measurement with a reduced variation of the measured distances.

It is to be noted that the plurality of bonding pads 9 which supply the pulse φSUB that is the exposure control signal may be arranged above and below, and to the right and left of the imaging area 8. As an example, in FIG. 6, the plurality of bonding pads 9 are arranged above and below, and to the right and left of the imaging area 8. In this way, the propagation differential delay of the pulse φSUB that is the exposure control signal is cancelled in the vertical direction (column direction) and in the horizontal direction (row direction) in the surface of the imaging area 8. This eliminates the variation of the amounts of exposure not only in the vertical direction but also in the horizontal direction in the surface of the imaging area, and makes it possible to perform highly precise measurement with a further reduced variation of the measured distances.

[Method for Driving Distance-Measuring Imaging Device]

Figure 7:
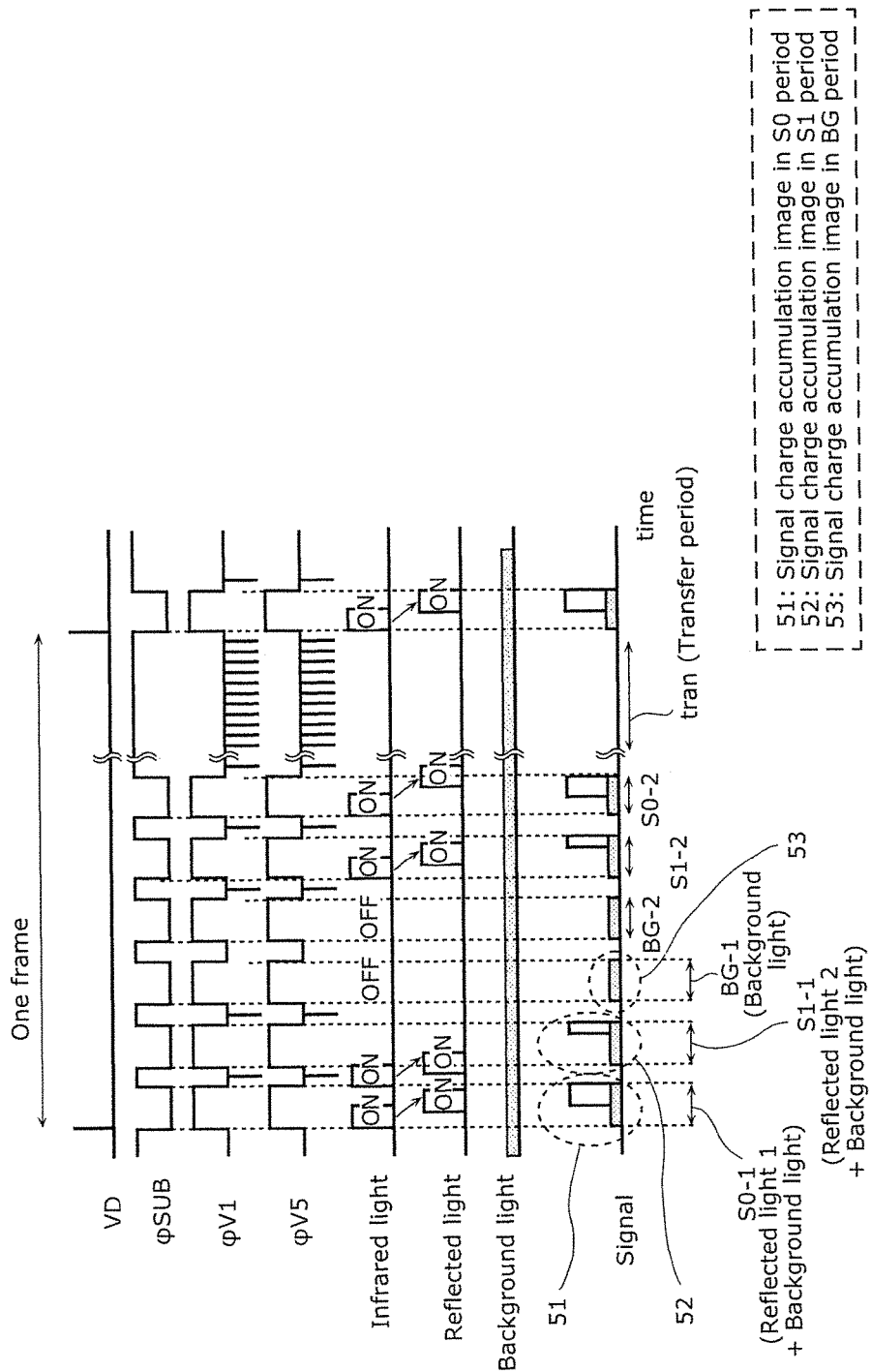
FIG. 7 is a timing chart illustrating an outline of operations performed by the distance-measuring imaging device according to Embodiment 1.

Next, descriptions are given of timings for operations performed by the distance-measuring imaging device 10 according to this embodiment. FIG. 7 illustrates a timing chart illustrating an outline of operations performed by the distance-measuring imaging device 10. This timing chart is an example of drive timings for reading signal charge generated in two horizontally adjacent PDs 21 to a corresponding VCCD 23 and vertically transferring the signal charge in one frame period.

FIG. 7 illustrates a vertical synchronization pulse VD, a pulse φSUB that is an exposure control signal, a φV1 and a φV5, infrared light irradiated from a light source unit 1, light reflected from a target object, a background light, and a signal indicating signal charge generated in the PDs 21.

The vertical synchronization pulse VD corresponds to 60 frames per second (60 fps). Three kinds of output signals are obtained from the solid state imaging element 20 in each of frame periods, with respect to an exposure period for PDs 21 determined by a pulse φSUB. Each of the output signals representing a different one of: (i) a signal charge accumulation image 51 in an S0 period in which light is irradiated in a first phase corresponding to a timing for irradiation of infrared light by the light source unit 1, and reflected light with delay according to a distance to the target object is received by a solid state imaging unit 2; (ii) a signal charge accumulation image 52 in an S1 period in which light is irradiated in a second phase corresponding to a timing for irradiation of infrared light by the light source unit 1, and reflected light with delay according to a distance to the target object is received by the solid state imaging unit 2; and (iii) a signal charge accumulation image 53 in a BG period in which the irradiation of infrared light by the light source unit 1 is stopped, and only background light is received by the solid state imaging unit 2.

Stated differently, signals output from the solid state imaging element 20 represent the following three images of different patterns: (i) a charge accumulation image obtained through exposure in an exposure period (S0 period) in which all of the light reflected from the target object after irradiation from the light source unit 1 is used; (ii) a charge accumulation image obtained through exposure in an exposure period (S1 period) in which a part of the light reflected from the target object is used; and (iii) a charge accumulation image obtained through exposure in an exposure period (BG period) in which no light reflected from the target object is used. Here, a set of the S0 period, the S1 period, and the BG period is repeated several times (for example, two times) per one frame.

To facilitate understanding of the present disclosure, in FIG. 7, the set of the S0 imaging with exposure in which all of the reflected light is used, the S1 imaging with exposure in which a part of the reflected light is used, and the BG imaging with exposure in which no reflected light is used is performed two times per one frame. However, the set may be performed approximately twenty times per one frame. By performing the set approximately twenty times per one frame in this way, it is possible to equalize the apparent S0 periods, S1 periods, and BG periods (that is, the average times of the S0 periods, the average times of the S1 periods, and the average times of the BG periods in one frame). Thus, it is possible to reduce a variation of the measured distances even when a target object moves quickly.

Furthermore, in FIG. 7, irradiation from the light source is performed one time in each of the S0-1, S1-1, and BG-1 periods in order to facilitate understanding of the present disclosure. However, it is preferable that irradiation be actually performed several times as illustrated in the timing charts of FIGS. 8 and 9 to be described below. Stated differently, it is preferable that exposure be performed several times in each period. For example, exposure is actually performed five hundred times in each period.

Figure 8:
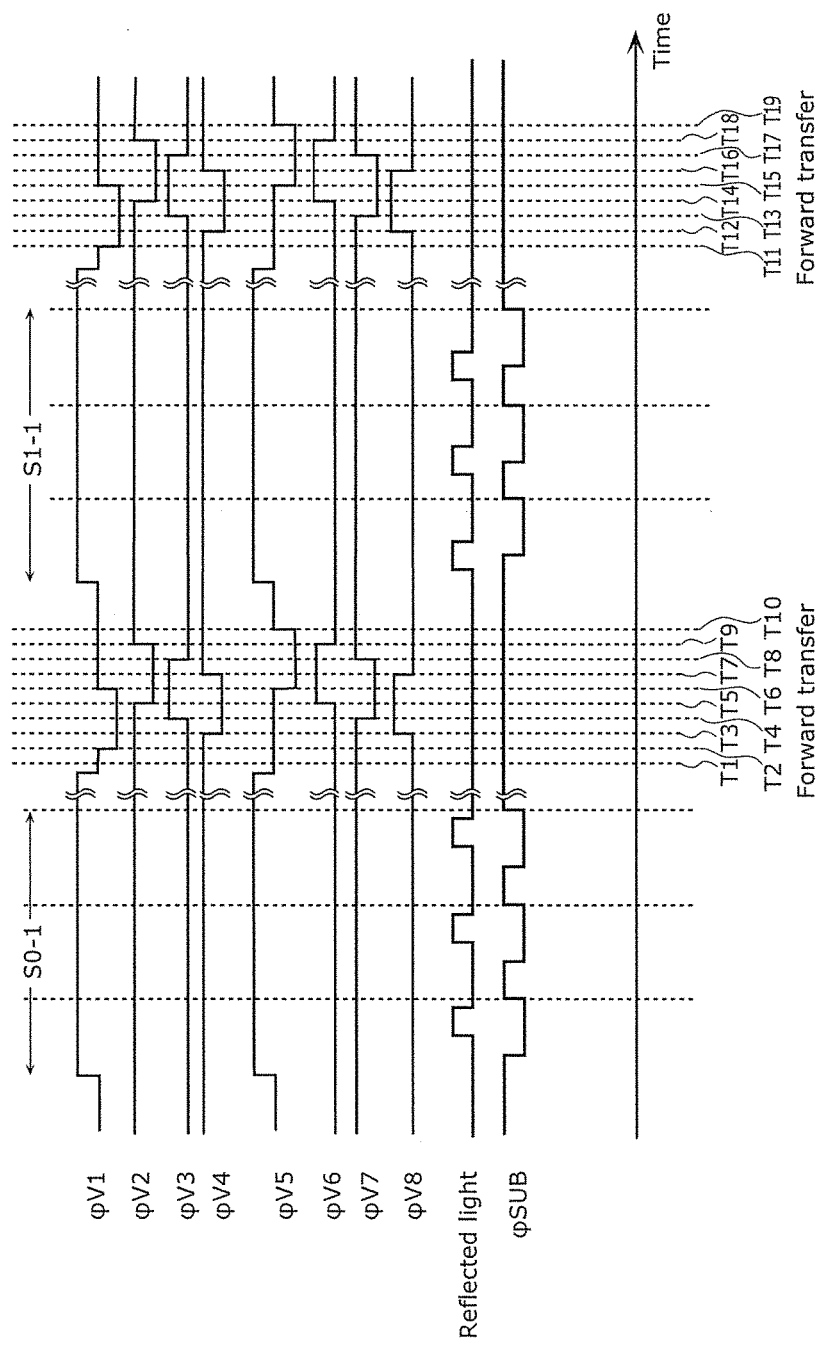
FIG. 8 is a timing chart illustrating details of operations performed by the distance-measuring imaging device according to Embodiment 1.
Figure 9:
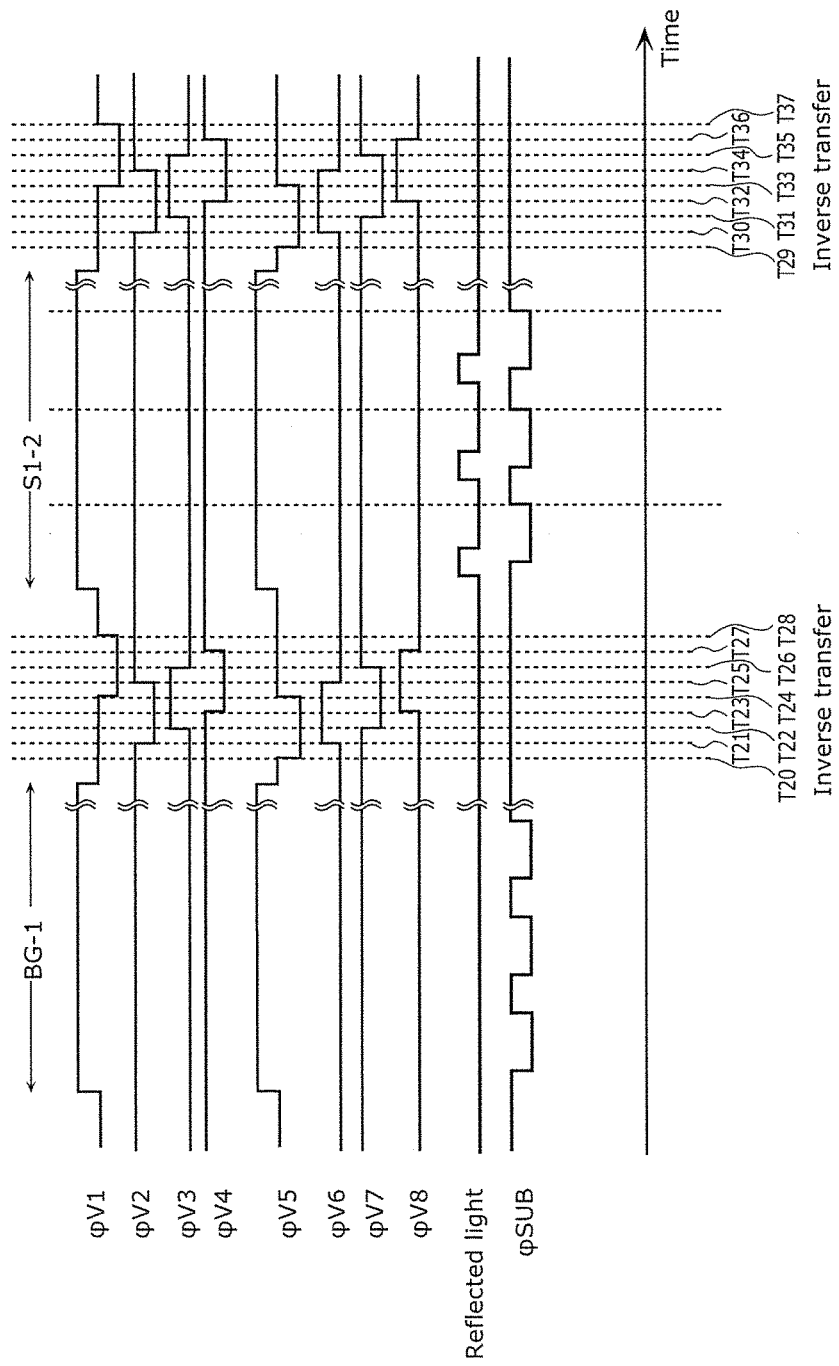
FIG. 9 is a timing chart illustrating details of operations performed by the distance-measuring imaging device according to Embodiment 1.
Figure 10:
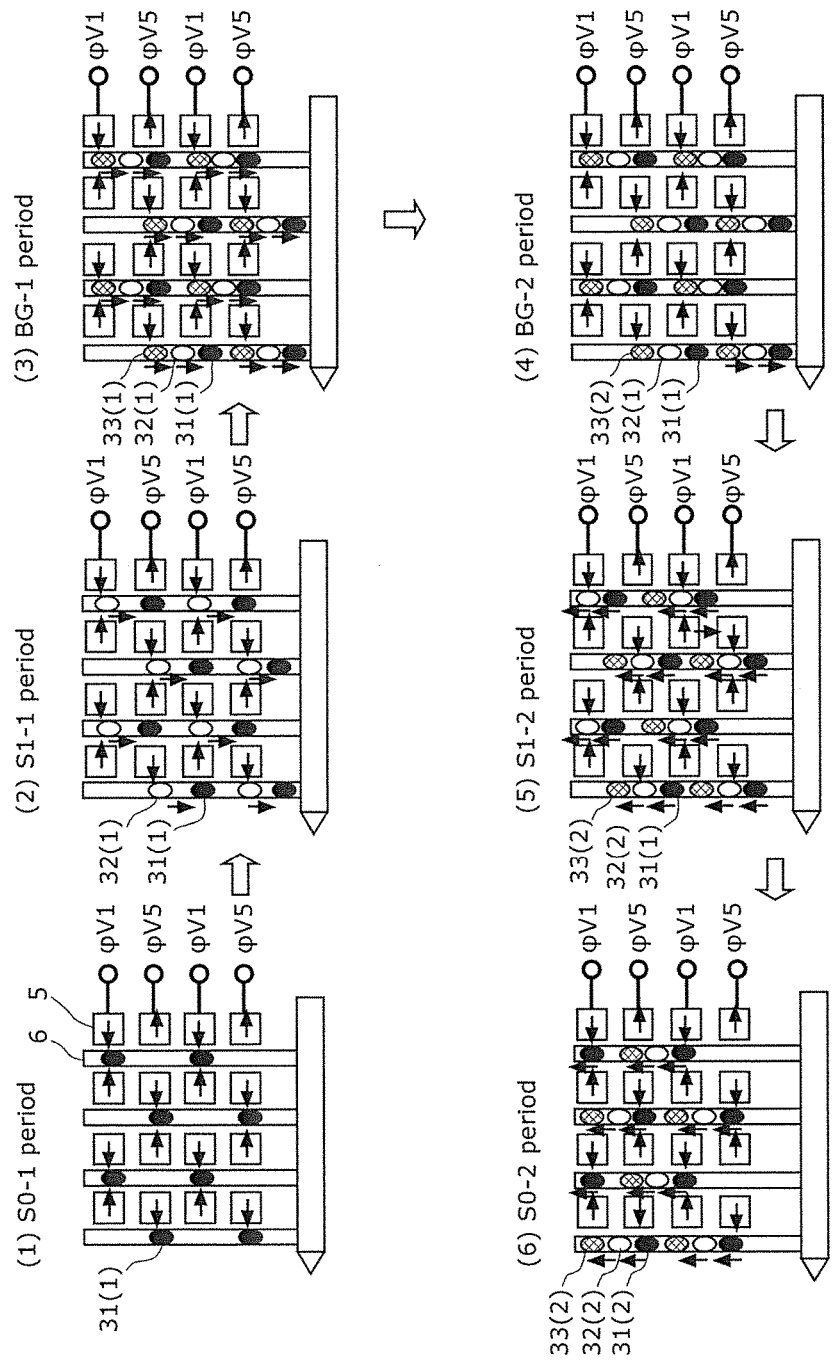
FIG. 10 is a diagram illustrating an image of additions and transfers of signal charge.

Hereinafter, details of operations performed by the distance-measuring imaging device 10 according to this embodiment are described with reference to FIGS. 8, 9, and 10. Each of FIGS. 8 and 9 is a timing chart illustrating the details of the operations performed by the distance-measuring imaging device 10. More specifically, FIG. 8 is a timing chart of the S0-1 period and the S1-1 period illustrated in FIG. 7, and FIG. 9 is a timing chart of the BG-1 period and the S1-2 period illustrated in FIG. 7. FIG. 10 is a diagram illustrating an image of additions and transfers of signal charge. A timing pulse for each of emission and reception of light is applied from the drive control unit 4.

As illustrated in FIG. 8, (i) exposure is started by firstly applying a pulse φSUB of H level to φV1 and φV5 in the S0-1 period and then lowering the level of the pulse φSUB to L level, (ii) infrared light is emitted from the light source unit 1 in synchronization with a phase of the pulse φSUB, and (iii) all of the reflected light with delay determined according to the distance to the target object and background light are received.

After these processes are repeated several times, signal charge accumulated in a VCCD 23 in an S0-1 period is stored as illustrated as signal charge 31(1) in (1) of FIG. 10. Next, by applying pulses φV1 to φV8 at timings corresponding to time Ti to T10 in FIG. 8, the signal charge 31(1) accumulated in the VCCD 23 in the S0-1 period is transferred in the forward direction in the VCCD 23, and no signal charge remains below the gates V1 and V5.

Next, (i) exposure is started by applying a pulse φSUB of H level to pulses φV1 and φV5 in the S1-1 period illustrated in FIG. 8, and then lowering the level of the pulse φSUB to L level, (ii) infrared light is emitted from the light source unit 1 in synchronization with a phase of the pulse φSUB, and (iii) all of the reflected light with delay determined according to the distance to the target object and background light are received.

After these processes are repeated several times, signal charge accumulated in a VCCD 23 in the S1-1 period is stored as illustrated as signal charge 32(1) in (2) of FIG. 10. At this time, the signal charge 31(1) accumulated in the S0-1 period and the signal charge 32(1) accumulated in the S1-1 period are stored in the VCCD 23 independently without being mixed. Next, by applying pulses φV1 to φV8 at timings corresponding to time T11 to T19 in FIG. 8, the signal charge 31(1) accumulated in the VCCD 23 in the S0-1 period and the signal charge 32(1) accumulated in the VCCD 23 in the S1-1 period are transferred in the forward direction in the VCCD 23, and no signal charge remains below the gates V1 and V5 again.

Next, (i) exposure is started by applying a pulse φSUB of H level to pulses φV1 and φV5 in the BG-1 period illustrated in FIG. 9, and then lowering the level of pulse φSUB to L level, (ii) the emission of infrared light from the light source unit 1 is stopped, and only the background light is received.

After these processes are repeated several times, signal charge accumulated in a VCCD 23 in a BG-1 period is stored as illustrated as signal charge 33(1) in (3) of FIG. 10. At this time, three kinds of signal charge that are the signal charge 31(1) accumulated in the S0-1 period, the signal charge 32(1) accumulated in the S1-1 period, and the signal charge 33(1) accumulated in the BG-1 period are stored in the VCCD 23 independently without being mixed.

Next, as illustrated in FIG. 7, an operation similar to an operation in the BG-1 period is performed again as an operation in a BG-2 period without signal charge in the VCCD 23 being transferred. In other words, the signal charge 33(1) in the BG-1 period and the signal charge in the BG-2 period are added to obtain the signal charge 33(2), and the signal charge 33(2) is to be stored in the VCCD 23. Next, by applying pulses φV1 to φV8 in the VCCD 23 at timings corresponding to time T20 to T28 in FIG. 9, the signal charge 31(1) accumulated in the S0-1 period, the signal charge 32(1) accumulated in the S1-1 period, and the signal charge 33(2) accumulated in the BG-2 period are transferred in the inverse direction in the VCCD 23.

Hereinafter, by performing exposure in the S1-2 period in the same manner as in the S1-1 period, the signal charge 32(1) accumulated in the S1-1 period and the signal charge accumulated in the S1-2 period are added in the VCCD 23 to obtain the signal charge 32(2), and the signal charge 32(2) is to be stored in the VCCD 23. Subsequently, an inverse transfer from the VCCD 23 is performed by applying a pulse to pulses φV1 to φV8 at times T29 to T37 illustrated in FIG. 9. Hereinafter, by performing exposure in the S0-2 period in the same manner as in the S0-1 period, the signal charge 31(1) accumulated in the S0-1 period and the signal charge accumulated in the S0-2 period are added in the VCCD 23 to obtain signal charge 31(2), and the signal charge 31(2) is to be stored in the VCCD 23.

After the entire sequence of operations is repeated several times, signal charge in a VCCD and signal charge in an HCCD are sequentially transferred in transfer periods illustrated in FIG. 7 as tran (transfer periods), and the signal charge is converted into signal voltages by the output amplifier 25, and the signal voltages are output from the CCD solid state imaging element 20. This sequence of operations is performed in one frame, and is repeated to complete an imaging operation.

In this way, in the distance-measuring imaging device 10 according to this embodiment, the part of the plurality of reading gates 22 read signal charge generated in corresponding PDs 21 leftward, and the remaining part of the plurality of reading gates 22 read signal charge generated in corresponding PDs 21 rightward in each of (i) a first exposure period (S0 period) in which the exposure is performed when the exposure control signal is received after a lapse of a first delay time, since a time when the light emission control signal is received by the light source unit 1 and (ii) a second exposure period (S1 period) in which the exposure is performed when the exposure control signal is received after a lapse of a second delay time longer than the first delay time, since a time when the light emission control signal is received by the light source unit 1.

Next, the image processing unit 3 illustrated in FIG. 1 calculates a distance. The distance that is Distance L is obtained according to Expression 1 above. This calculation is performed by the image processing unit as per each of pixel addresses in the CCD solid state imaging element 20, thereby obtaining distance image information (distance information) representing a video of distance images which are outputs from the distance-measuring imaging device.

When reading signal charge from all of the PDs 21 in the S0, S1, and BG periods in the above sequence of operations, the structure of the PDs 21 which are light receiving units of the solid state imaging element 20 and the VCCDs 23 completely satisfies a geometric right-left symmetry. Thus, it is possible to reduce property deterioration due to shading components in the distance images.

As described above, the solid state imaging element 20 and the distance-measuring imaging device 10 according to this embodiment are not affected by leak-in of diagonally incident light at the edges of the surface of the imaging area 8 in the solid state imaging element 20, and cancel propagation delay of the exposure control signal in the valid pixel area, thereby performing highly precise distance measurement. In addition, it is possible to reduce a measurement variation in the imaging area 8 in the solid state imaging element 20, thereby achieving high distance measurement precision.

Specifically, the solid state imaging element 20 according to this embodiment includes: a plurality of PDs 21 (light receiving units) which generate signal charge (charge) through exposure; and a plurality of reading gates 22 (charge reading units) which are arranged one-to-one with the plurality of PDs 21, and read the signal charge generated by the plurality of PDs 21. A part of the plurality of reading gates 22 are arranged at the left side of corresponding ones of the PDs 21, and read signal charge generated by the corresponding PDs 21 leftward, and the remaining part of the plurality of reading gates 22 are arranged at the right side of corresponding ones of the PDs 21, and read signal charge generated by the corresponding PDs 21 rightward.

Arranging the part of the plurality of reading gates 22 at the left side of the corresponding PDs 21 and arranging the remaining part of the plurality of reading gates 22 at the right side of the corresponding PDs 21 enable reduction in measurement variation in the imaging area 8 (light receiving surface). More specifically, each of the VCCDs 23 and the corresponding PDs 21 have the geometric right-left symmetry, and thus can reduce a variation of the amounts of light that leaks into the VCCD 23 and reduce the measurement variation in the imaging area 8 (light receiving surface). In addition, the plurality of boding pads 9 which receive a pulse φSUB (exposure control signal) that instructs exposure are arranged either (i) above and below, or (ii) above and below, and to the right and left of the imaging area 8, and thus it is possible to reduce the variation of the amounts of exposure in either the vertical direction or the vertical and horizontal directions on the surface of the imaging area 8. As a result, it is possible to achieve further higher measurement precision.

Stated differently, the plurality of bonding pads 9 are arranged at least at positions opposite to each other above and below the imaging area 8 (at positions above and below, and to the right and left of the imaging area 8 in this embodiment). More specifically, in this embodiment, the plurality of PDs 21 are arranged in the matrix in the imaging area 8. The plurality of bonding pads 9 are arranged at the positions opposite to each other above and below (in the column direction) and at the positions opposite to each other to the right and left (in the row direction) of the imaging area 8.

In addition, the PDs 21 whose signal charge is read leftward and the PDs 21 whose signal charge is read rightward are arranged alternately in the column and row directions. In this way, it is possible to further reduce a variation of the distance information in the imaging area 8.

The solid state imaging element 20 is a CCD solid state imaging element. The exposure control signal has a substrate voltage for causing charge in the plurality of PDs 21 to overflow. This makes it possible to perform what is called a global reset that is an operation of resetting the plurality of PDs 21 collectively, thereby achieving further higher measurement precision.

Figure 11:
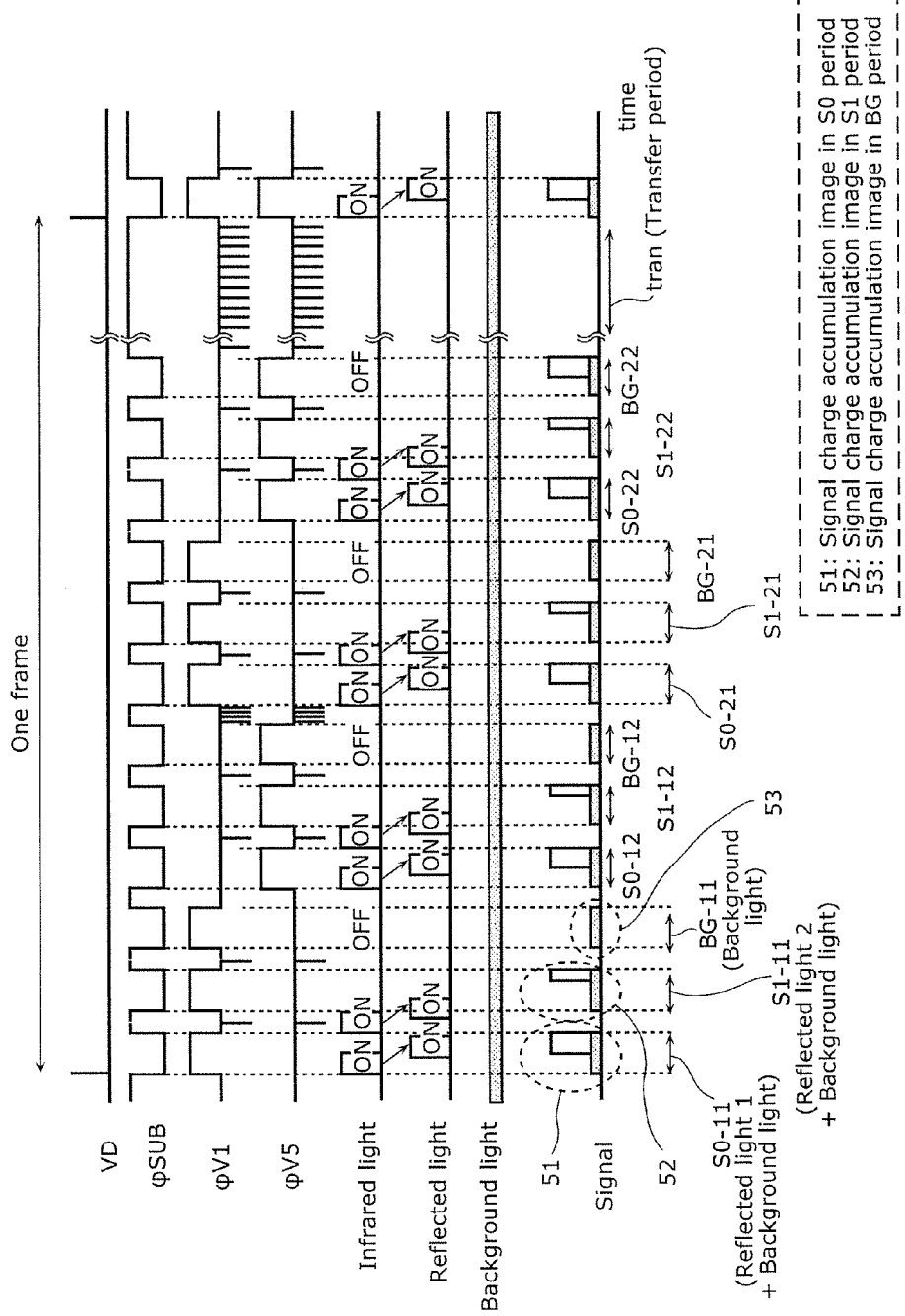
FIG. 11 is a timing chart illustrating an outline of operations performed by the distance-measuring imaging device according to Embodiment 1.

Next, descriptions are given of timings for operations performed by the distance-measuring imaging device 10 according to this embodiment. FIG. 11 illustrates a timing chart illustrating an outline of operations performed by the distance-measuring imaging device 10. This timing chart is an example of drive timings for reading signal charge generated in two horizontally adjacent PDs 21 to a corresponding VCCD 23, and vertically transferring the signal charge in one frame period.

FIG. 11 illustrates a vertical synchronization pulse VD, a pulse φSUB that is an exposure control signal, pulses φV1 and φV5, infrared light irradiated from a light source unit 1, light reflected from a target object, a background light, and a signal indicating signal charge generated in the PDs 21.

The vertical synchronization pulse VD corresponds to 60 frames per second (60 fps). Three kinds of output signals are obtained from the solid state imaging element 20 in each of frame periods, with respect to an exposure period for PDs 21 determined by a pulse φSUB. Each of the output signals representing a different one of: (i) a signal charge accumulation image 51 in an S0 period in which light is irradiated in a first phase corresponding to a timing for irradiation of infrared light by the light source unit 1, and reflected light with delay according to a distance to the target object is received by a solid state imaging unit 2; (ii) a signal charge accumulation image 52 in an S1 period in which light is irradiated in a second phase corresponding to a timing for irradiation of infrared light by the light source unit 1, and reflected light with delay according to a distance to the target object is received by the solid state imaging unit 2; and (iii) a signal charge accumulation image 53 in a BG period in which the irradiation of infrared light by the light source unit 1 is stopped, and only background light is received by the solid state imaging unit 2.

Stated differently, signals output from the solid state imaging element 20 represent the following three images of different patterns: (i) a charge accumulation image obtained through exposure in an exposure period (S0 period) in which all of the light reflected from the target object after irradiation from the light source unit 1 is used; (ii) a charge accumulation image obtained through exposure in an exposure period (S1 period) in which a part of the light reflected from the target object is used; and (iii) a charge accumulation image obtained through exposure in an exposure period (BG period) in which no light reflected from the target object is used. Here, a set of the S0 period, the S1 period, and the BG period is repeated several times (for example, two times) per one frame.

To facilitate understanding of the present disclosure, in FIG. 11, the set of the S0 imaging with exposure in which all of the reflected light is used, the S1 imaging with exposure in which a part of the reflected light is used, and the BG imaging with exposure in which no reflected light is used is performed two times per one frame. However, the set may be performed approximately twenty times. By performing the set approximately twenty times per one frame in this way, it is possible to equalize the apparent S0 periods, S1 periods, and BG periods (that is, the average times of the S0 periods, the average times of the S1 periods, and the average times of the BG periods in one frame). Thus, it is possible to reduce a variation of the measured distances even when a target object moves quickly.

Furthermore, to facilitate understanding of the present disclosure, in FIG. 11, irradiation from the light source is performed one in each of (i) the S0-11, S1-11, BG-11, S0-21, S1-21, and BG-21 periods in each of which a pulse φSUB of H level is applied to a pulse V1, and (ii) the S0-12, S1-12, BG-12, S0-22, S1-22, and BG-22 periods in each of which a pulse φSUB of H level is applied to a pulse φV5. However, it is preferable that irradiation be actually performed several times as illustrated in the timing charts of FIGS. 12, 13, 14, 15, 16, and 17 to be described below. Stated differently, it is preferable that exposure be performed several times in each period. For example, it is actually preferable that exposure be performed five hundred times in each period.

Figure 12:
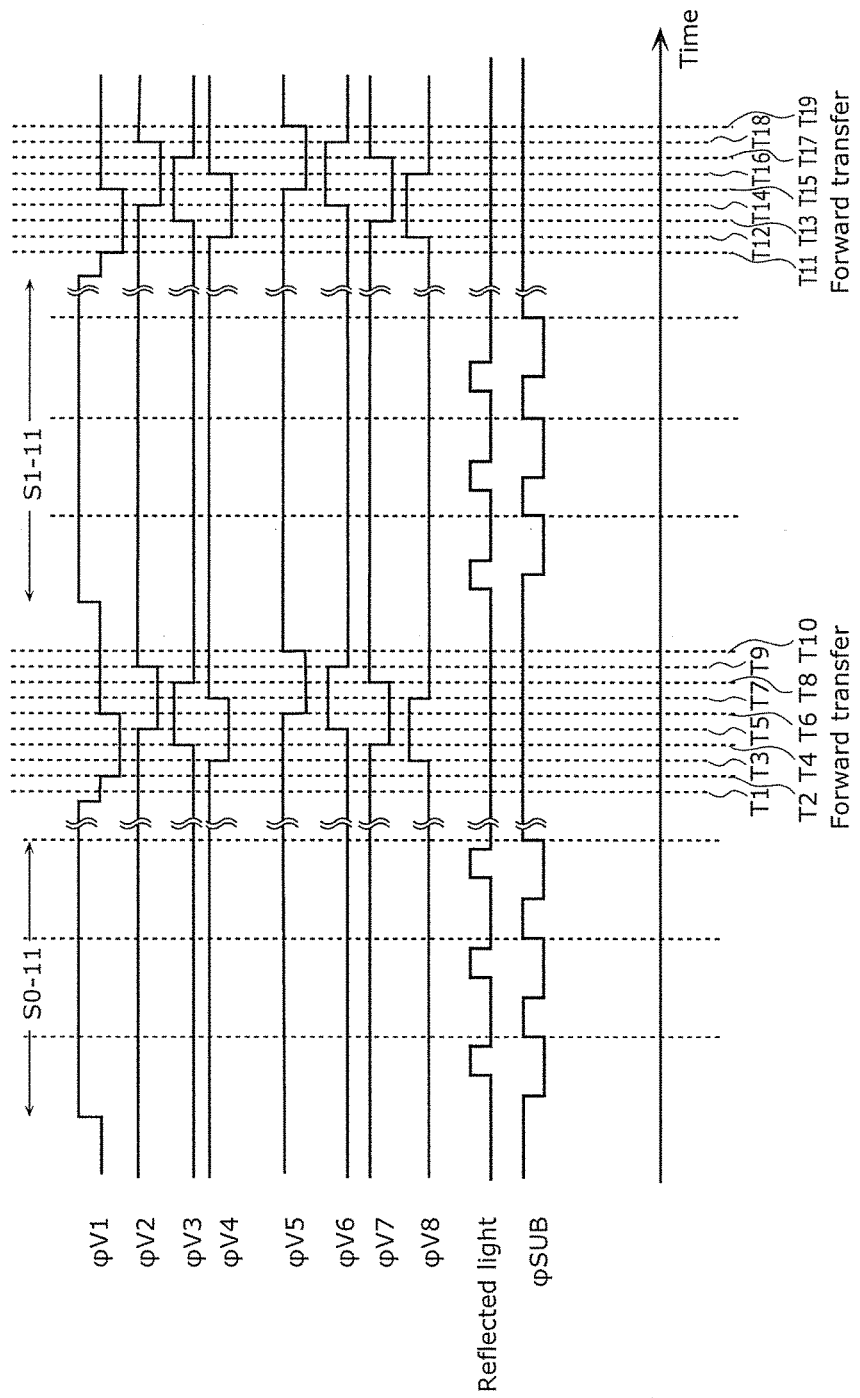
FIG. 12 is a timing chart illustrating an outline of operations performed by the distance-measuring imaging device according to Embodiment 1.
Figure 13:
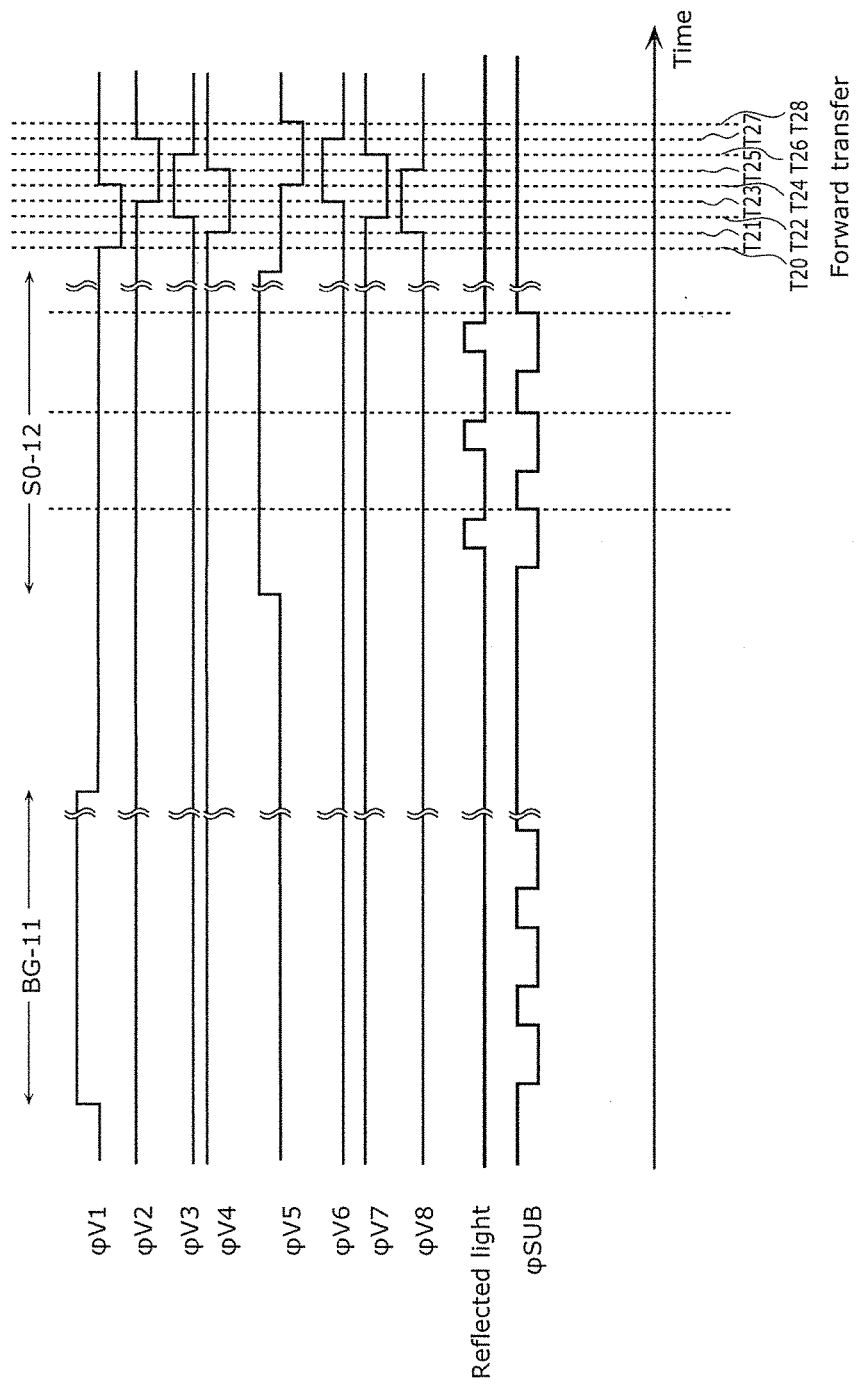
FIG. 13 is a timing chart illustrating an outline of operations performed by the distance-measuring imaging device according to Embodiment 1.
Figure 14:
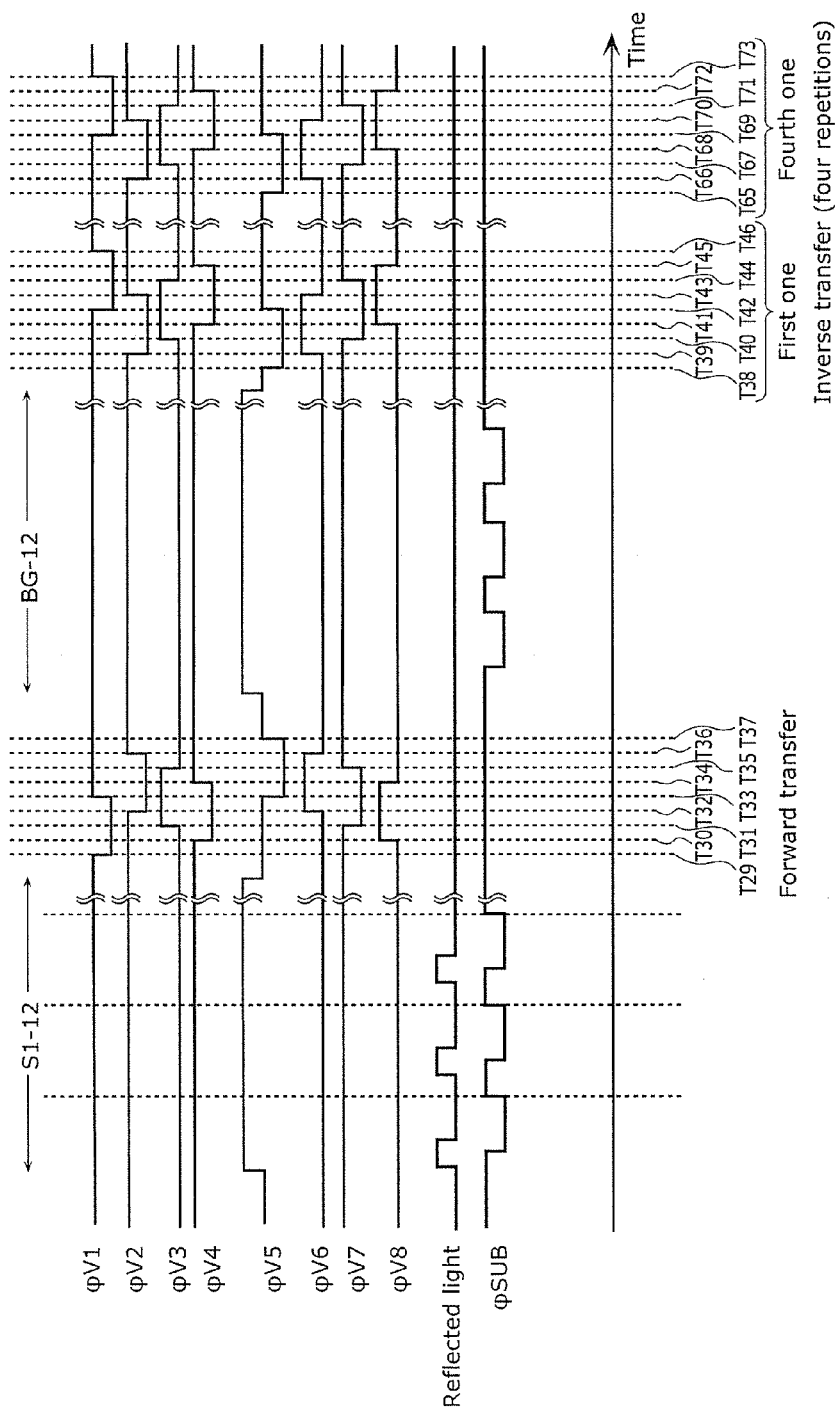
FIG. 14 is a timing chart illustrating an outline of operations performed by the distance-measuring imaging device according to Embodiment 1.
Figure 15:
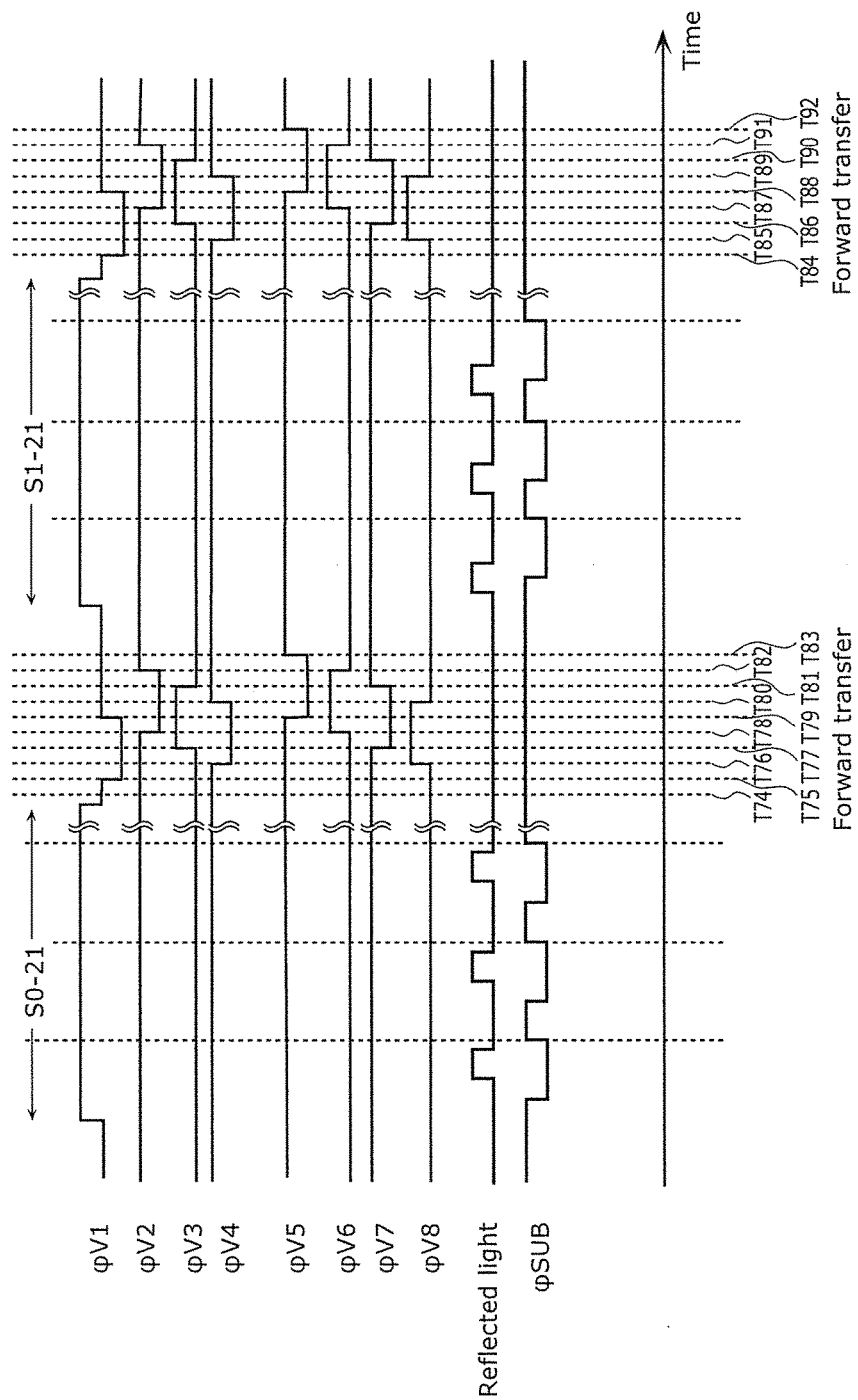
FIG. 15 is a timing chart illustrating an outline of operations performed by the distance-measuring imaging device according to Embodiment 1.
Figure 16:
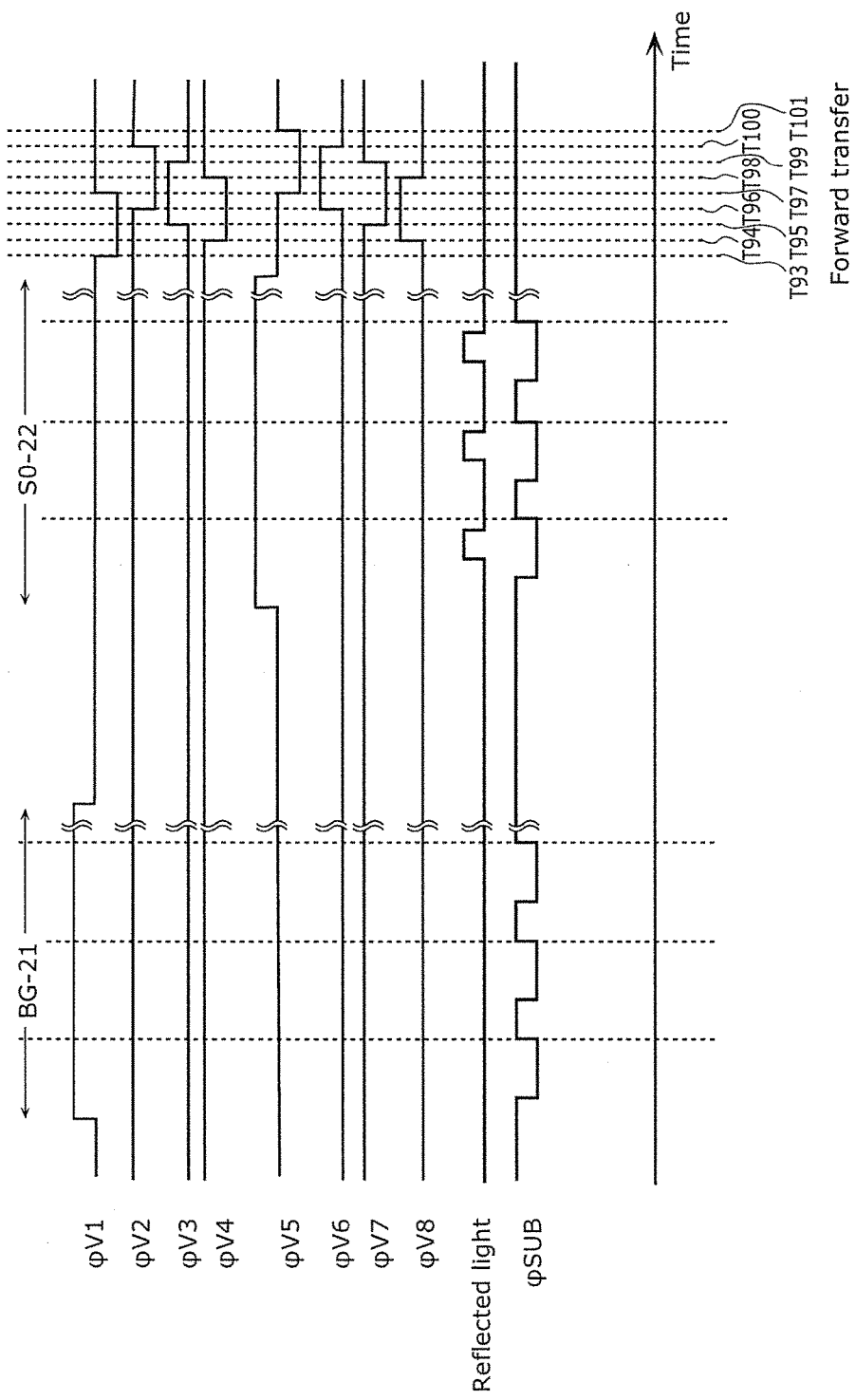
FIG. 16 is a timing chart illustrating an outline of operations performed by the distance-measuring imaging device according to Embodiment 1.
Figure 17:
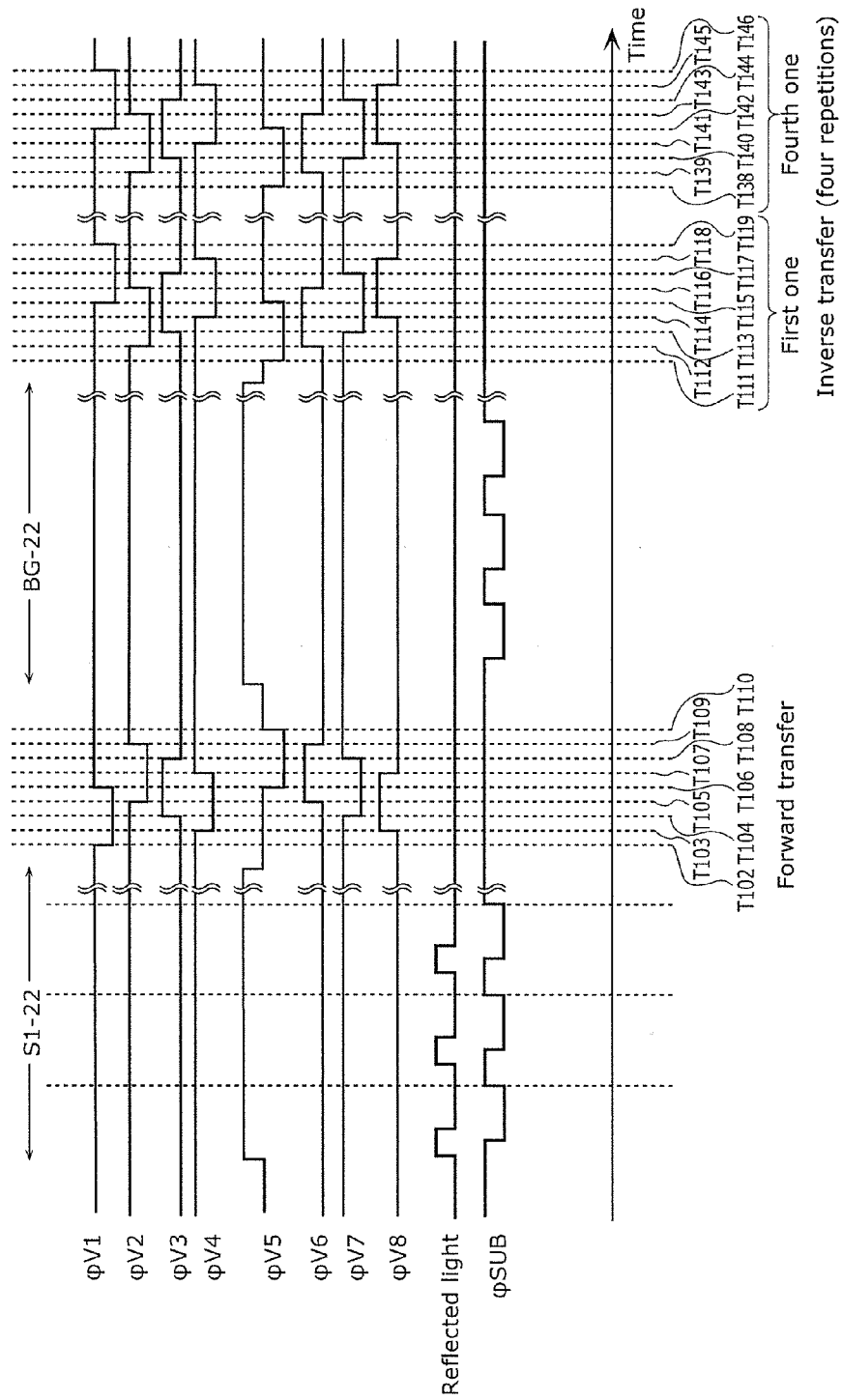
FIG. 17 is a timing chart illustrating an outline of operations performed by the distance-measuring imaging device according to Embodiment 1.
Figure 18A:
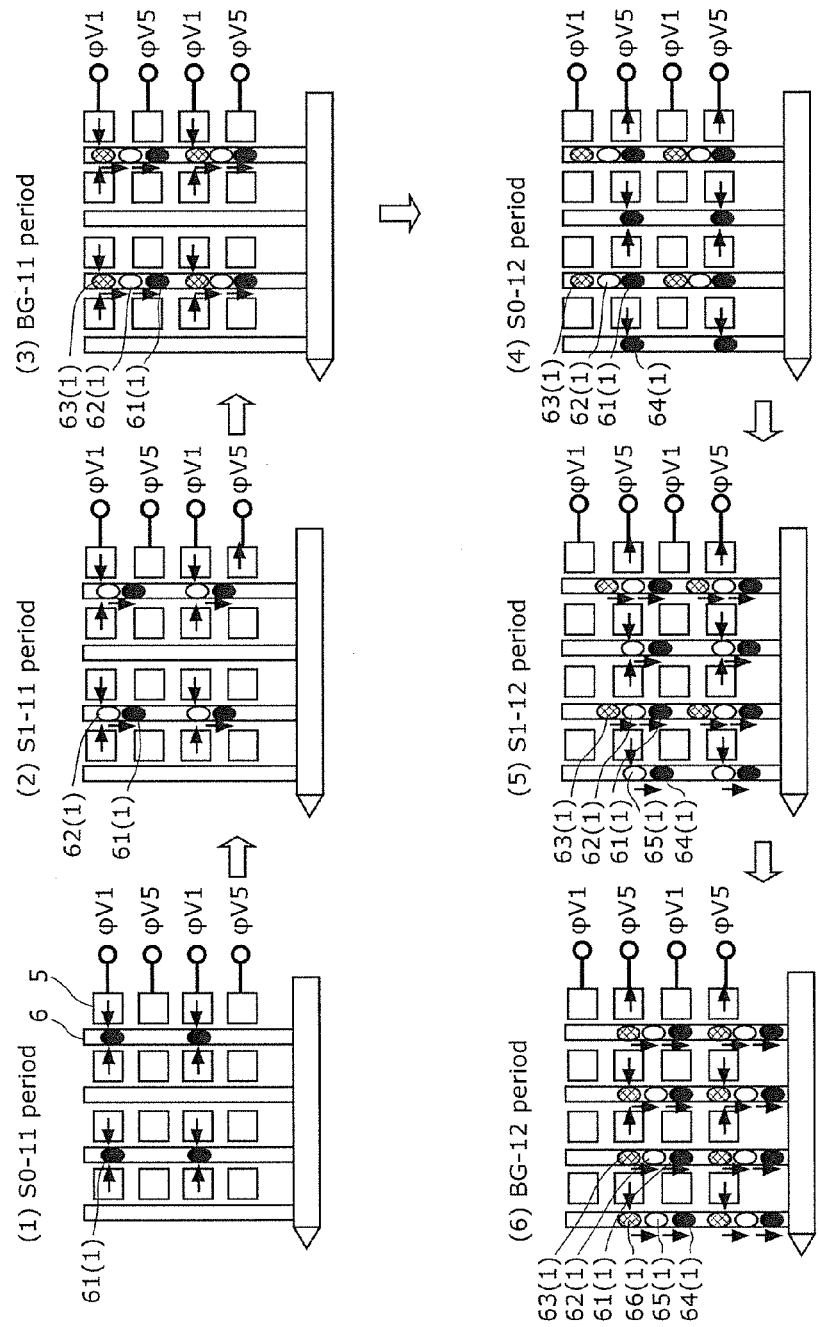
FIG. 18A is a diagram illustrating an image of additions and transfers of signal charge.
Figure 18B:
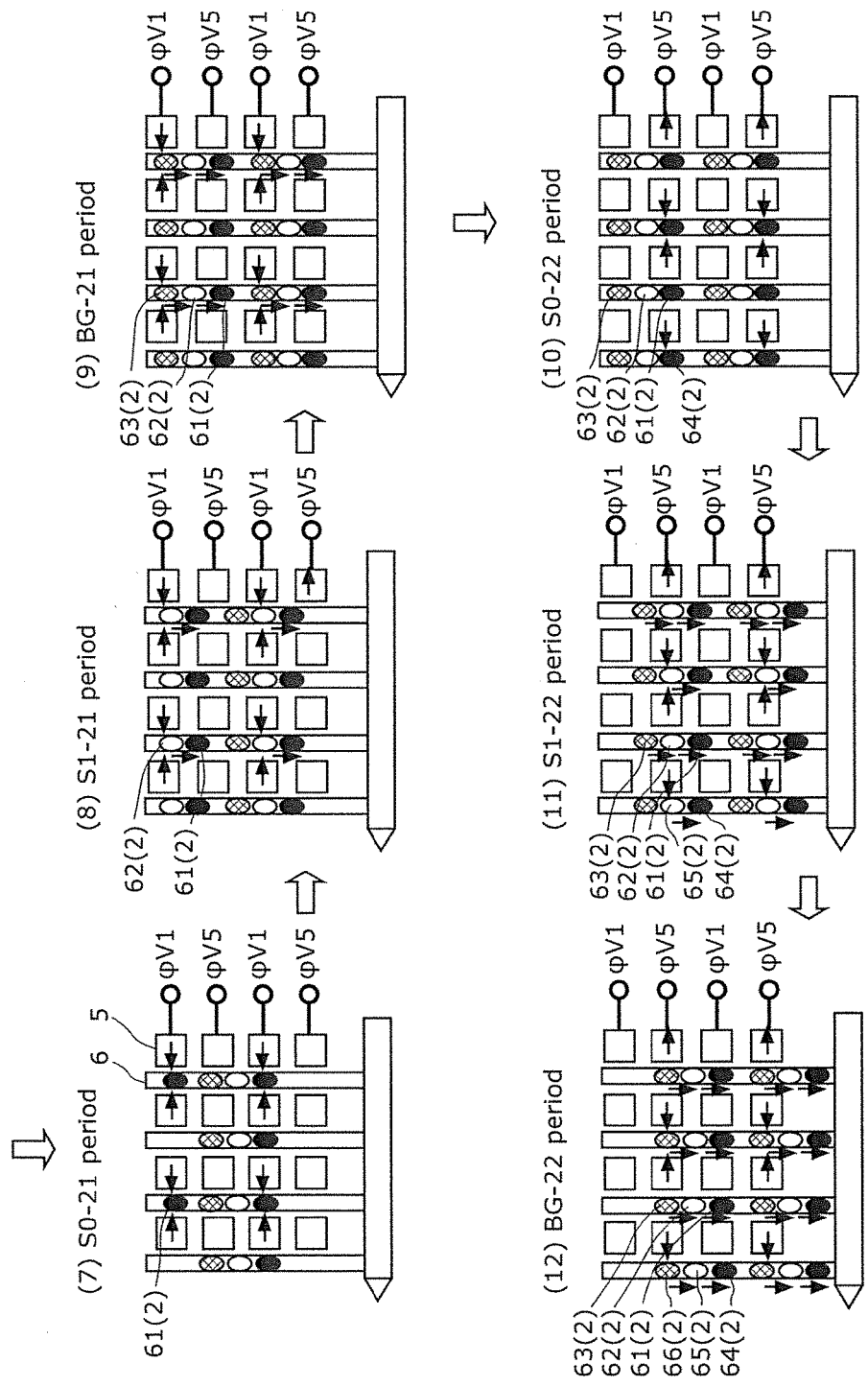
FIG. 18B is a diagram illustrating an image of additions and transfers of signal charge.

Hereinafter, details of operations performed by the distance-measuring imaging device 10 according to this embodiment are described with reference to FIGS. 12, 13, 14, 15, 16, 17, 18A, and 18B. Each of FIGS. 12, 13, 14, 15, 16, and 17 is a timing chart illustrating details of other operations performed by the distance-measuring imaging device 10 as specifically described as follows: FIG. 12 is a timing chart of the S0-11 period and the S1-11 period illustrated in FIG. 11; FIG. 13 is a timing chart of the BG-11 period and the S0-12 period illustrated in FIG. 11; FIG. 14 is a timing chart of the S1-12 period and the BG-12 period illustrated in FIG. 11; FIG. 15 is a timing chart of the S0-21 period and the S1-21 period illustrated in FIG. 11; FIG. 16 is a timing chart of the BG-21 period and the S0-22 period illustrated in FIG. 11; and FIG. 17 is a timing chart of the S1-22 period and the BG-22 period illustrated in FIG. 11. Each of FIGS. 18A and 18B is a diagram illustrating an image of additions and transfers of signal charge. A timing pulse for each of emission and reception of light is applied from the drive control unit 4.

As illustrated in FIG. 12, (i) exposure is started by firstly applying a pulse φSUB of H level to a pulse φV1 in the S0-11 period and then lowering the level of the pulse φSUB to L level, (ii) infrared light is emitted from the light source unit 1 in synchronization with a phase of the pulse φSUB, and (iii) all of the reflected light with delay determined according to the distance to the target object and background light are received.

After these processes are repeated several times, signal charge accumulated in a VCCD 23 in an S0-1 period is stored as illustrated as signal charge 61(1) in (1) of FIG. 18A. Next, by applying pulses φV1 to φV8 applied at timings corresponding to time Ti to T10 in FIG. 12, the signal charge 61(1) accumulated in the VCCD 23 in the S0-11 period in the VCCD 23 is transferred in the forward direction in the VCCD 23, and no signal charge remains below the gate V1.

Next, (i) exposure is started by applying a pulse φSUB of H level to a pulse φV1 in the S1-11 period illustrated in FIG. 12, and then lowering the level of the pulse φSUB to L level, (ii) infrared light is emitted from the light source unit 1 in synchronization with the phase of the pulse φSUB, and (iii) all of the reflected light with delay determined according to the distance to the target object and background light are received.

After these processes are repeated several times, signal charge accumulated in a VCCD 23 in an S1-11 period is stored as illustrated as signal charge 62(1) in (2) of FIG. 18A. At this time, the signal charge 61(1) accumulated in the S0-11 period and the signal charge 62(1) accumulated in the S1-11 period are stored in the VCCD 23 independently without being mixed. Next, by applying pulses φV1 to φV8 at timings corresponding to time T11 to T19 in FIG. 12, the signal charge 61(1) accumulated in the VCCD 23 in the S0-11 period and signal charge 62(1) accumulated in the VCCD 23 in the S1-11 period are transferred in the forward direction in the VCCD 23, and no signal charge remains below the gate V1 again.

Next, (i) exposure is started by applying a pulse φSUB of H level to a pulse φV1 in the BG-1 period illustrated in FIG. 13, and then lowering the level of pulse φSUB to L level, (ii) the emission of infrared light from the light source unit 1 is stopped, and only the background light is received.

After these processes are repeated several times, signal charge accumulated in a VCCD 23 in a BG-11 period is stored as illustrated as signal charge 63(1) in (3) of FIG. 18A. At this time, three kinds of signal charge that are the signal charge 61(1) accumulated in the S0-11 period, the signal charge 62(1) accumulated in the S1-11 period, and the signal charge 63(1) accumulated in the BG-11 period are stored in the VCCD 23 independently without being mixed.

Next, as illustrated in FIG. 13, (i) exposure is started by firstly applying a pulse φSUB of H level to a pulse φV5 in the S0-12 period and then lowering the level of the pulse φSUB to L level, (ii) infrared light is emitted from the light source unit 1 in synchronization with a phase of the pulse φSUB, and (iii) all of the reflected light with delay determined according to the distance to the target object and background light are received.

After these processes are repeated several times, signal charge accumulated in a VCCD 23 in an S0-12 period is stored as illustrated as signal charge 64(1) in (4) of FIG. 18A. Next, by applying pulses φV1 to φV8 at timings corresponding to Time T20 to T28 in FIG. 13, the signal charge 61(1) accumulated in the VCCD 23 in the S0-11 period, the signal charge 62(1) accumulated in the VCCD 23 in the S1-11 period, the signal charge 63(1) accumulated in the VCCD 23 in the BG-11 period, and the signal charge 64(1) accumulated in the VCCD 23 in the S0-12 period are transferred in the forward direction in the VCCD 23, and no signal charge remains below the gate V5.

Next, (i) exposure is started by firstly applying a pulse φSUB of H level to a pulse φV5 in the S1-12 period and then lowering the level of the pulse φSUB to L level, (ii) infrared light is emitted from the light source unit 1 in synchronization with a phase of the pulse φSUB, and (iii) a part of the reflected light with delay determined according to the distance to the target object and background light are received.

After these processes are repeated several times, signal charge accumulated in a VCCD 23 in an S1-12 period is stored as illustrated as signal charge 65(1) in (5) of FIG. 18A. At this time, the signal charge 64(1) accumulated in the S0-12 period and the signal charge 65(1) accumulated in the S1-12 period are stored in the VCCD 23 independently without being mixed. Next, by applying pulses φV1 to φV8 at timings corresponding to Time T29 to T37 in FIG. 14, the signal charge 61(1) accumulated in the VCCD 23 in the S0-11 period, the signal charge 62(1) accumulated in the VCCD 23 in the S1-11 period, the signal charge 63(1) accumulated in the VCCD 23 in the BG-11 period, and the signal charge 64(1) accumulated in the VCCD 23 in the S0-12 period are transferred in the forward direction in the VCCD 23, and no signal charge remains again below the gate V5.

Next, (i) exposure is started by applying a pulse φSUB of H level to a pulse φV5 in the BG-12 period illustrated in FIG. 14, and then lowering the level of pulse φSUB to L level, (ii) the emission of infrared light from the light source unit 1 is stopped, and only the background light is received.

After these processes are repeated several times, signal charge accumulated in a VCCD 23 in a BG-12 period is stored as illustrated as signal charge 66(1) in (6) of FIG. 18A. At this time, three kinds of signal charge that are the signal charge 64(1) accumulated in the S0-12 period, the signal charge 65(1) accumulated in the S1-12 period, and the signal charge 66(1) accumulated in the BG-21 period are stored in the VCCD 23 independently without being mixed. Next, by applying pulses φV1 to φV8 accumulated at timings corresponding to time T38 to T73 in FIG. 14, the signal charge 61(1) accumulated in the VCCD 23 in the S0-11 period, the signal charge 62(1) accumulated in the VCCD 23 in the S1-11 period, the signal charge 63(1) accumulated in the VCCD 23 in the BG-11 period, the signal charge 64(1) accumulated in the VCCD 23 in the S0-12 period, the signal charge 65(1) accumulated in the VCCD 23 in the S1-12 period, and the signal charge 66(1) accumulated in the VCCD 23 in the BG-12 period are transferred in the inverse direction in the VCCD 23.

Next, as illustrated in FIG. 15, an operation similar to an operation in the S0-11 period is performed again as an operation in an S0-21 period. Specifically, the signal charge 61(1) in the S0-11 period and the signal charge in the S0-21 period are added in the VCCD 23 to obtain signal charge 61(2) as illustrated in (7) of FIG. 18B, and the signal charge 61(2) is to be stored in the VCCD 23. Next, by applying pulses φV1 to φV8 at timings corresponding to time T74 to T83 in FIG. 15, the signal charge 61(2) accumulated in the S0-11 period and the S0-21 period, the signal charge 62(1) accumulated in the VCCD 23 in the S1-11 period, the signal charge 63(1) accumulated in the VCCD 23 in the BG-11 period, the signal charge 64(1) accumulated in the VCCD 23 in the S0-12 period, the signal charge 65(1) accumulated in the VCCD 23 in the S1-12 period, and the signal charge 66(1) accumulated in the VCCD 23 in the BG-12 period are transferred in the forward direction in the VCCD 23.

By performing exposure in which the same operations as in the S1-21 period are performed, the signal charge accumulated in the S1-11 period and the signal charge accumulated in the S1-21 period as illustrated in (8) of FIG. 18B are added in the VCCD 23 to be signal charge 62(2). Subsequently, by applying a pulse to φV1 to φV8 at times T84 to T92 illustrated in FIG. 15, the signal charge is transferred in the forward direction in the VCCD 23. Likewise, in the BG-21 period, by performing exposure in which the same operations as in the BG-11 period are performed, the signal charge accumulated in the BG-11 period and the signal charge accumulated in the BG-21 period as illustrated in (9) of FIG. 18B are added in the VCCD 23 to be signal charge 63(2). Subsequently, by performing exposure in which the same operations as in the S0-12 period are performed likewise without transferring the signal charge in the VCCD 23, the signal charge accumulated in the S0-12 period and the signal charge accumulated in the S0-22 period as illustrated in (10) of FIG. 18B are added in the VCCD 23 to be signal charge 64(2). Subsequently, by applying a pulse to φV1 to φV8 at times T93 to T101 illustrated in FIG. 16, the signal charge is transferred in the forward direction in the VCCD 23. Likewise, by performing exposure in which the same operations as in the S1-12 period are performed, the signal charge accumulated in the S1-12 period and the signal charge accumulated in the S1-22 period as illustrated in (11) of FIG. 18B are added in the VCCD 23 to be signal charge 65(2). Subsequently, by applying a pulse to φV1 to φV8 at times T102 to T110 illustrated in FIG. 17, the signal charge is transferred in the forward direction in the VCCD 23. Likewise, in the BG-22 period, by performing exposure in which the same operations as in the BG-12 period are performed, the signal charge accumulated in the BG-12 period and the signal charge accumulated in the BG-22 period as illustrated in (12) of FIG. 18B are added in the VCCD 23 to be signal charge 66(2).

After the entire sequence of operations is repeated several times, signal charge in a VCCD and signal charge in an HCCD are sequentially transferred, and the signal charge is converted into signal voltages by the output amplifier 25, and the signal voltages are output from the CCD solid state imaging element 20. This sequence of operations is performed in one frame, and is repeated to complete an imaging operation.

In this way, in the distance-measuring imaging device 10 according to this embodiment, a part of a plurality of reading gates 22 read signal charge generated in corresponding PDs 21 leftward, and the remaining part of the plurality of reading gates 22 read signal charge generated in corresponding PDs 21 rightward in each of (i) a first exposure period (S0 period) in which the exposure is performed when the exposure control signal is received after a lapse of a first delay time, since a time when the light emission control signal is received by the light source unit 1 and (ii) a second exposure period (S1 period) in which the exposure is performed when the exposure control signal is received after a lapse of a second delay time longer than the first delay time, since a time when the light emission control signal is received by the light source unit 1.

Next, the image processing unit 3 illustrated in FIG. 1 calculates a distance. The distance that is Distance L is obtained according to Expression 1 above. This calculation is performed by the image processing unit as per each of pixel addresses in the CCD solid state imaging element 20, thereby obtaining distance image information (distance information) representing a video of distance images which are outputs from the distance-measuring imaging device.

When reading signal charge from all of the PDs 21 in the S0, S1, and BG periods in the above sequence of operations, the structure of the PDs 21 which are light receiving units of the solid state imaging element 20 and the VCCDs 23 completely satisfies a geometric right-left symmetry. Thus, it is possible to reduce property deterioration due to shading components in the distance images.

Figure 19:
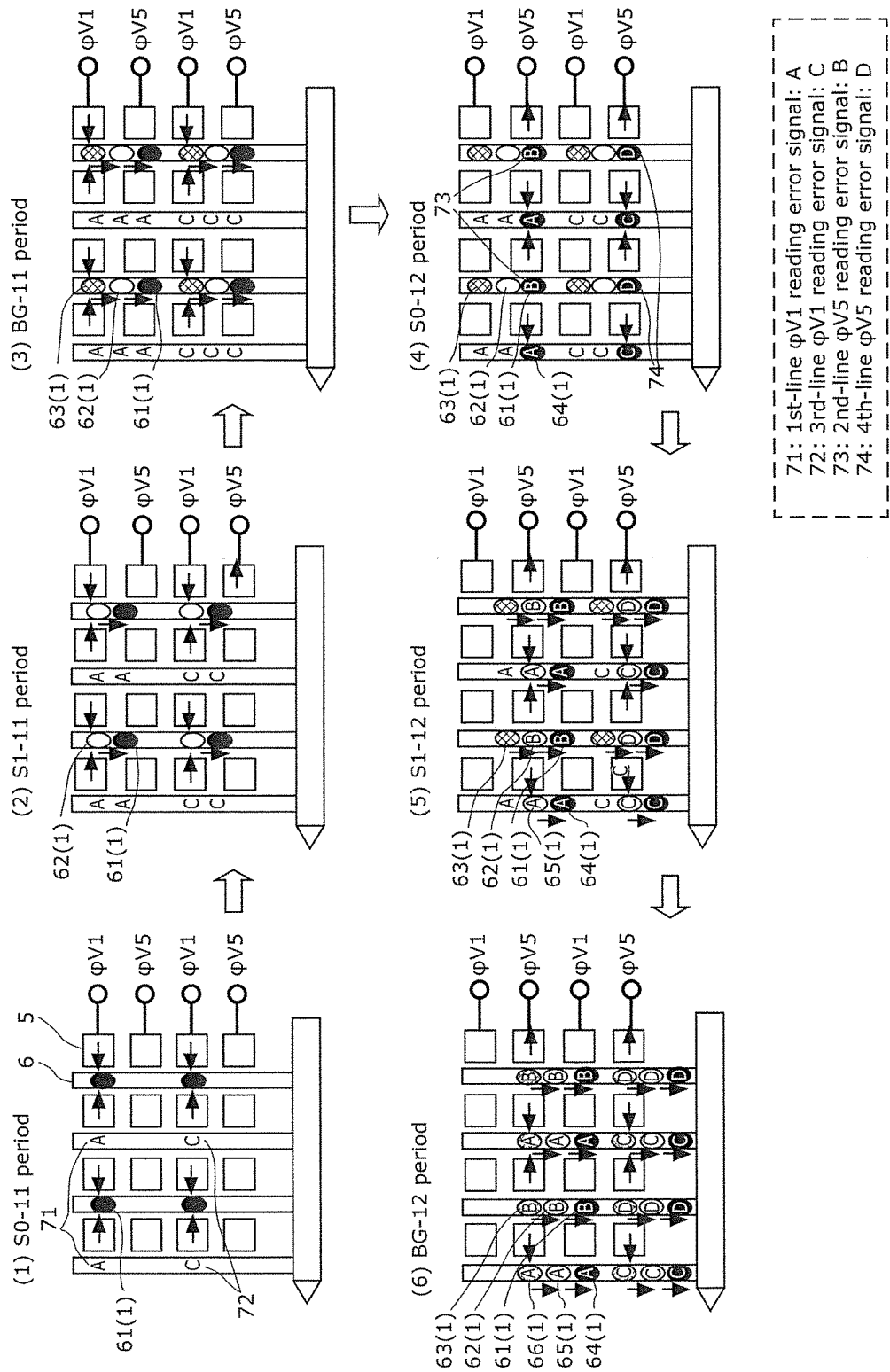
FIG. 19 is a diagram illustrating an image of transfers of reading error (variation) signal charge.

Furthermore, FIG. 19 is a diagram illustrating an image of additions and transfers of reading error signals, when generated, to accumulation signal charge performed through the sequence of operations. When a pulse φSUB of H level is applied to a reading gate, the reading error is generated in a VCCD 23 at a side at which the reading gate of corresponding PDs 21 is not disposed. FIG. 19 illustrates an image of additions and transfers to signal charge, assuming that: a reading error signal by φV1 on the first line in the drawing is A; a reading error signal by φV5 on the second line in the drawing is B; a reading error signal by φV1 on the third line in the drawing is C; and a reading error signal by φV5 on the fourth line in the drawing is D. Through the sequence of operations, as illustrated in (6) of FIG. 19, (i) each of the signal charge 61(1) accumulated in the S0-11 period, the signal charge 62(1) accumulated in the S1-11 period, and the signal charge 63(1) accumulated in the BG-11 period equally includes one or more reading error signals B and one or more reading error signals D the numbers of which are equal to each other, and (ii) each of the signal charge 64(1) accumulated in the S0-12 period, the signal charge 65(1) accumulated in the S1-12 period, and the signal charge 66(1) accumulated in the BG-12 period equally includes one or more reading error signals A and one or more reading error signals C the numbers of which are equal to each other. In other words, since the reading error signals A, B, C, and D are equally included in each of the S0, S1, and BG periods through the sequence of operations, all of reading error signals have been cancelled, and thus Distance L calculated according to Expression 1 above does not include any reading error signals.

In view of the above, the solid state imaging element 20 and the distance-measuring imaging device 10 according to this embodiment are capable of cancelling distance variations due to reading errors that occur when the reading gate in the solid state imaging element 20 is set to H level, thereby enabling variation-less distance measurement with further increased precision.

Embodiment 2

With reference to the drawings, a configuration of a distance-measuring device according to Embodiment 2 and operations performed thereby are described below focusing on differences from Embodiment 1. The distance-measuring device according to this embodiment includes an image processing unit that is different in configuration from the image processing unit of the distance-measuring imaging device 10 according to Embodiment 1.

Figure 20:
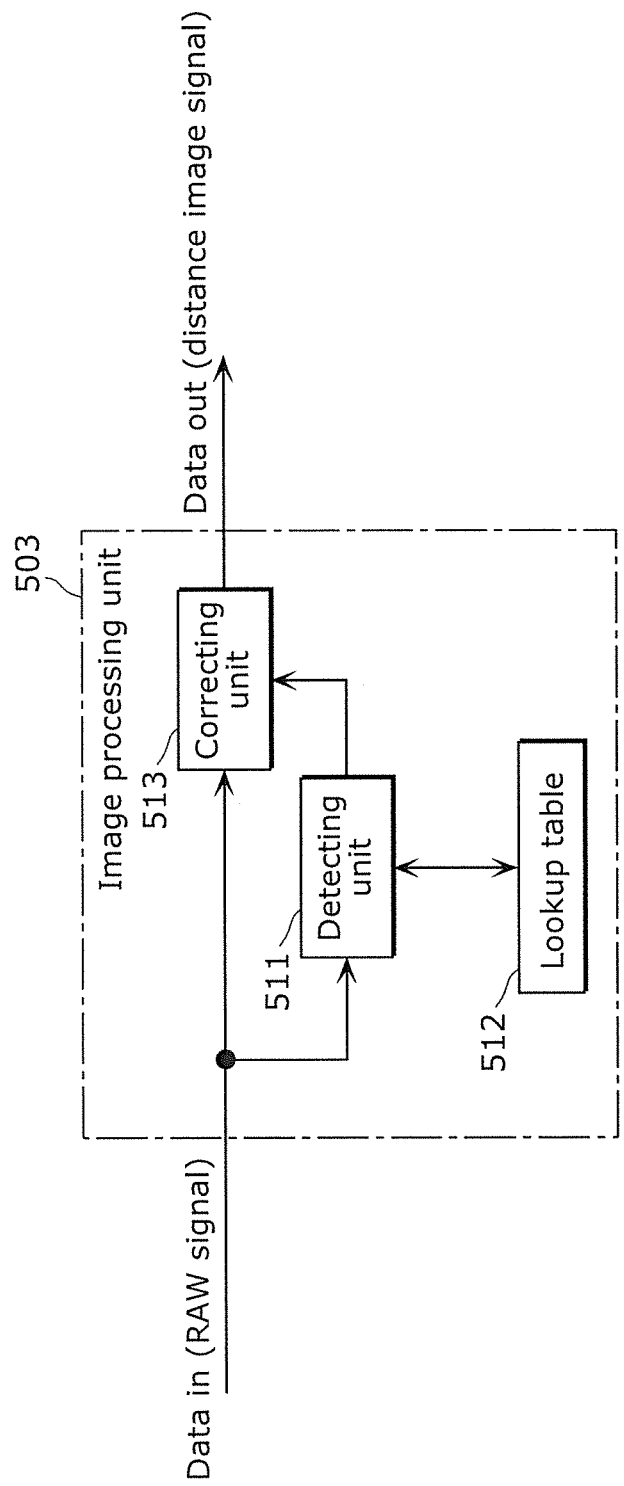
FIG. 20 is a block diagram illustrating a configuration of an image processing unit in Embodiment 2.

FIG. 20 is a block diagram illustrating a configuration of the image processing unit 503 according to this embodiment. Compared to the image processing unit 3 in Embodiment 1, the image processing unit 503 includes a means for correcting imaging area shading that is a variation of distance image information (that may be referred to as a distance signal below) on a light receiving surface (a variation of distance signals in an imaging area 8) in a solid state imaging element.

As illustrated in FIG. 20, the means for correcting imaging area shading includes: a detecting unit 511 (shading component detecting unit) which detects an imaging area shading component from a RAW signal output from a solid state imaging unit 2 including the solid state imaging element 20; a lookup table 512 which holds the shading component in each of surface areas detected by the detecting unit 511; and a correcting unit 513 which corrects imaging area shading of a distance signal based on the shading component in the surface area stored in the lookup table 512.

Figure 21:
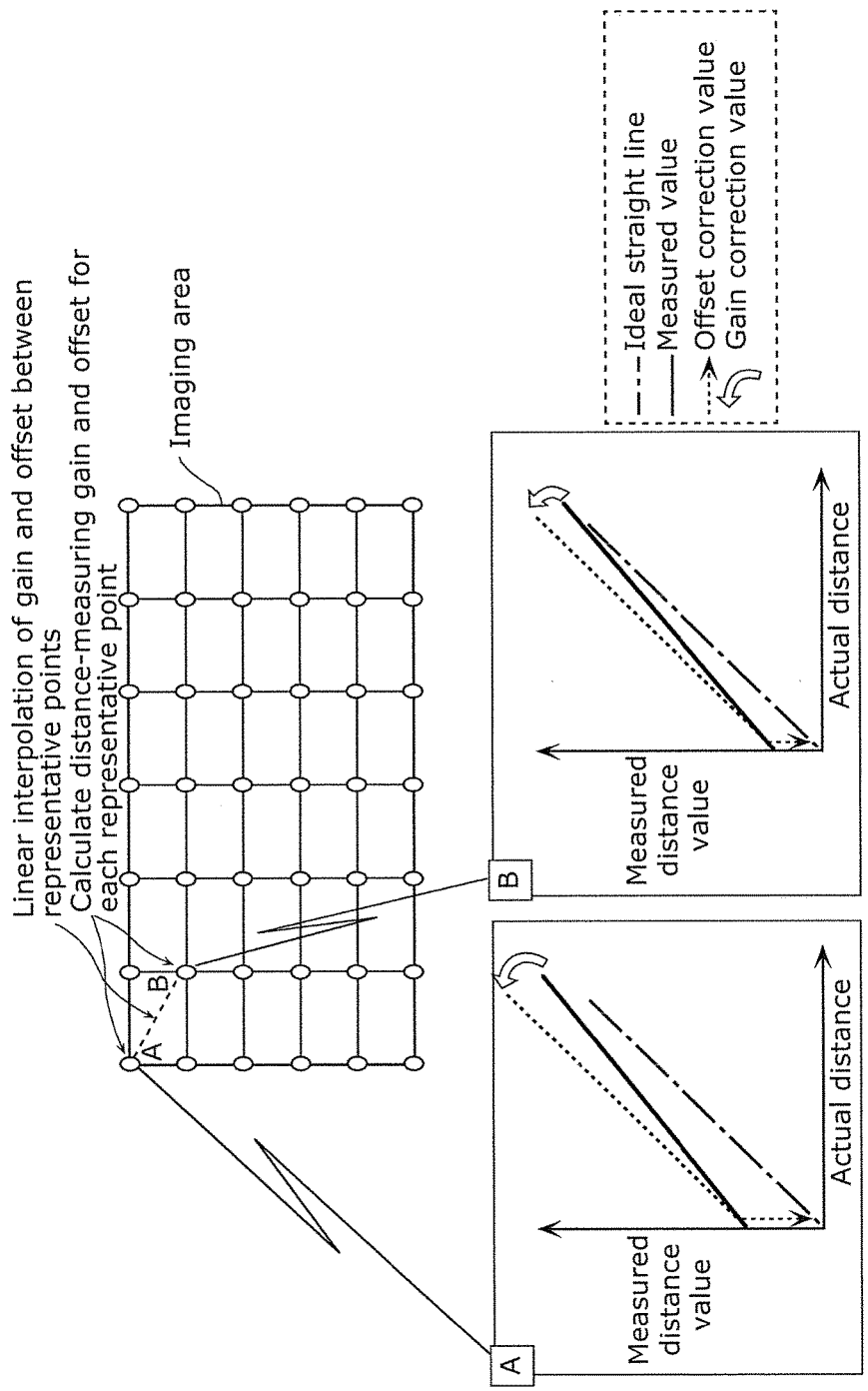
FIG. 21 is a diagram illustrating an example of a correction concept of imaging area shading that is a variation of distance information in an imaging area of a distance signal in the solid state imaging element.

FIG. 21 is a diagram illustrating an example of a correction concept of imaging area shading that is the variation of distance signals in an imaging area of the solid state imaging element 20. As illustrated in FIG. 21, the imaging area in the solid state imaging element 20 is divided into a plurality of segments, representative points are set for the respective segments. For each representative point, at least one of a distance measurement offset and a distance measurement gain (slope) is calculated from the difference between the actual distance and a measured distance value, and the calculation result is stored in the lookup table 512 as a correction value. Furthermore, distance measurement offsets or distance measurement gains (slope) between the representative points are calculated by performing linear interpolation, and imaging area shading of distance signals is corrected by the correcting unit 513. With this configuration, the imaging area shading which is the variation of distance signals in the imaging area 8 in the solid state imaging element 20 is corrected, providing an advantageous effect of being able to perform distance measurement with high precision.

Figure 22:
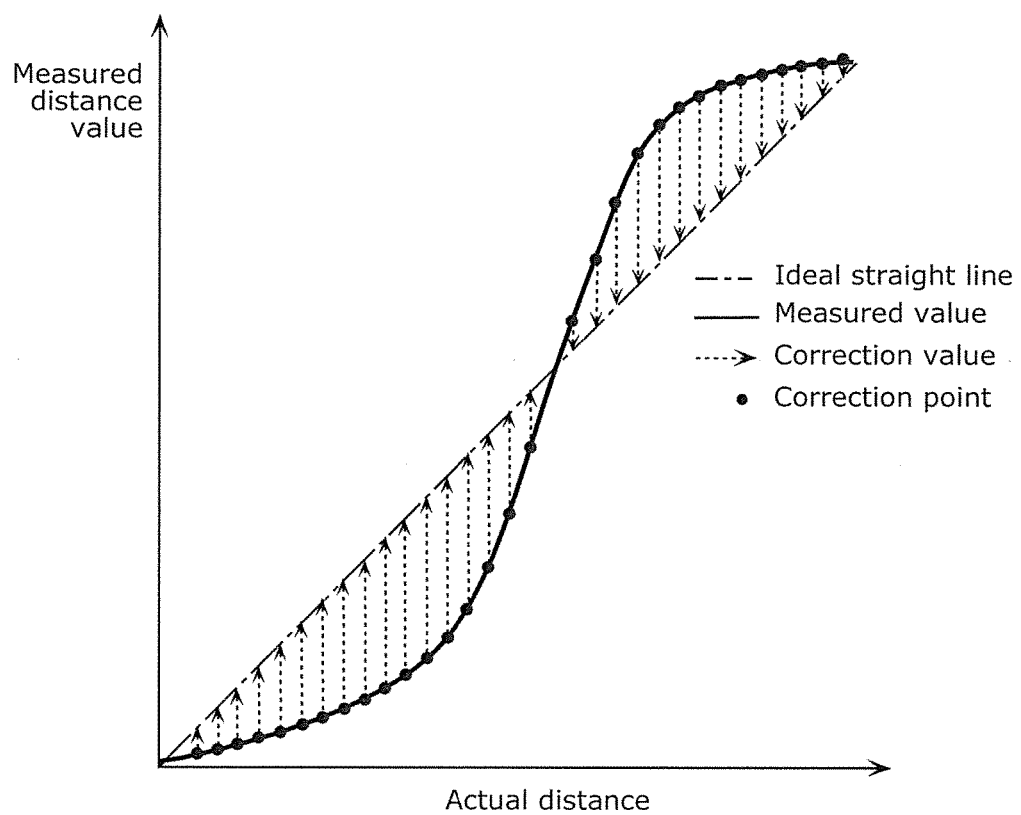
FIG. 22 is a diagram illustrating an example of another correction concept of imaging area shading that is a variation of distance information in the imaging area in the solid state imaging element.

FIG. 22 is a diagram illustrating an example of another correction concept of imaging area shading that is a variation of distance signals in the imaging area in the solid state imaging element 20 according to this embodiment. The imaging area 8 in the solid state imaging element 20 is divided into segments, and representative points are set for the respective segments. For each representative point, the difference between an actual distance and a measured distance value is calculated and stored in the lookup table 512 as a correction value. Furthermore, correction values between the representative points are calculated, and the imaging area shading of the distance signals is corrected by the correcting unit 513. With this configuration, the imaging area shading which is the variation of the distance signals in the imaging area 8 of the solid state imaging element 20 is corrected with increased precision, providing an advantageous effect of being able to perform distance measurement with further increased precision.

In any of the corrections above, each of the representative points may be a single pixel, or a plurality of pixels. In the case of the plurality of pixels, each of actual distances and measured distance values may be an average value, or a median value.

Figure 23:
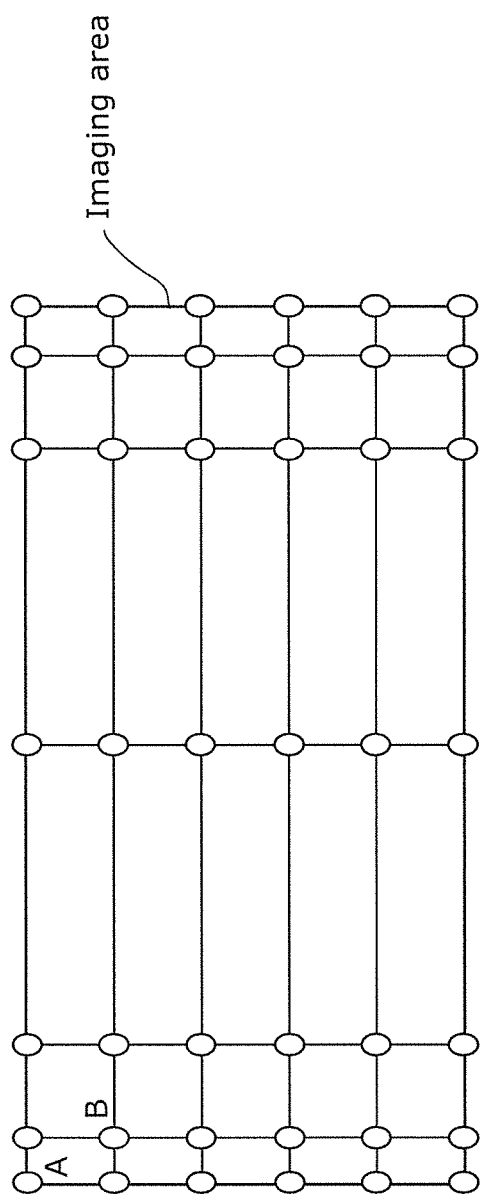
FIG. 23 is a diagram illustrating an example of segments.
Figure 24:
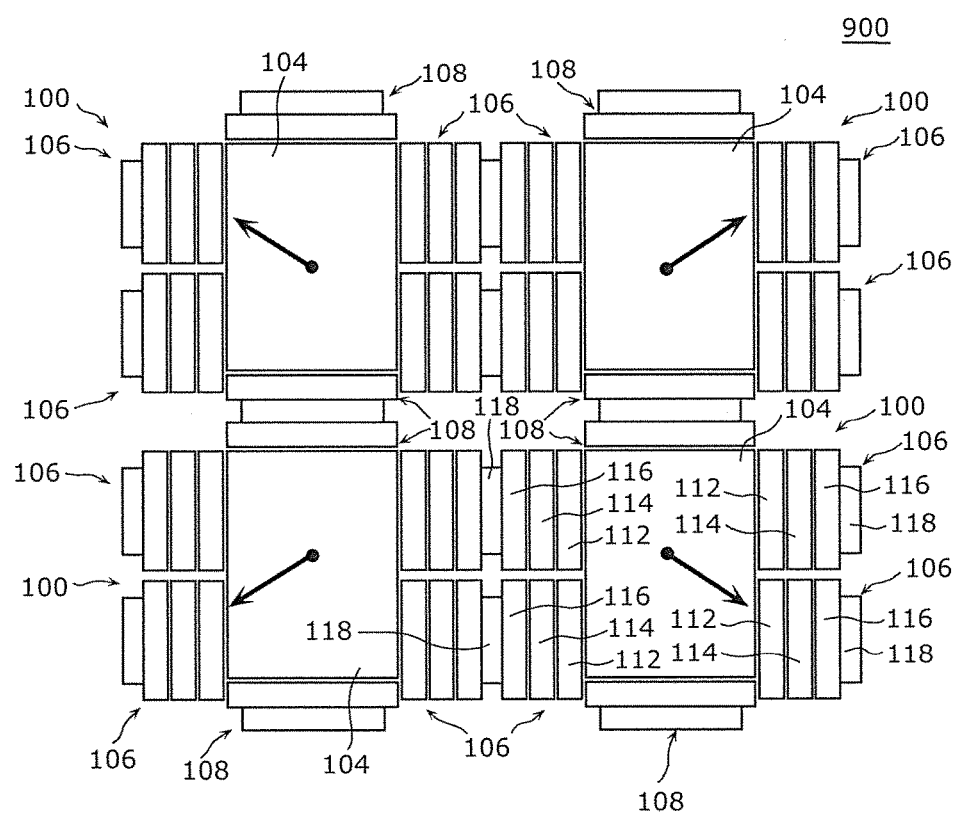
FIG. 24 is a plan view illustrating a part of a unit pixel of a conventional solid state imaging element.

It is to be noted that the segments are not limited to be equal-sized ones, and may be different-sized ones as illustrated in FIG. 23. In the example of segments of the imaging area in the solid state imaging element illustrated in FIG. 23, the sizes of the segments are smaller toward the ends of the imaging area. This configuration increases the precision of correction toward the ends of the imaging area in which the distance variations are large due to leaked-in incident light with a large incidence angle, and thus provides an advantageous effect of being able to perform distance measurement with high precision with reduced imaging area shading.

In addition, interpolation of distance measurement offsets and distance measurement gains (slope) between the respective points and interpolation of correction values between the respective points are not limited to linear interpolation.

Likewise the distance-measuring imaging device 10 according to Embodiment 1, the distance-measuring imaging device according to this embodiment is capable of performing highly precise distance measurement without the influence of leaked-in diagonally incident light at the ends of the light receiving surface (imaging area 8) in the solid state imaging element 20 and without propagation delay of exposure control signals in the valid pixel area. In addition, it is possible to reduce a measurement variation in the imaging area 8 in the solid state imaging element 20, thereby achieving high distance measurement precision. Compared to the distance-measuring imaging device 10 according to Embodiment 1, the distance-measuring imaging device according to this embodiment is capable of performing high-level correction of imaging area shading, and thus can enable distance measurement with further increased precision.

Although the distance-measuring imaging devices and the solid state imaging elements based on the embodiments have been described above, the distance-measuring imaging devices and the solid state imaging elements according to the present disclosure are not limited to the ones based on the embodiments. The present disclosure covers other embodiments obtainable by arbitrarily combining some constituent elements of the above embodiments, modifications obtainable by adding, to the embodiments, various kinds of modifications conceivable by a person skilled in the art within the scope of the present disclosure, and various kinds of devices that mounts a distance measurement device and a solid state imaging element according to the present disclosure.

In each of the above embodiments, the use of a CCD image sensor (CCD solid state imaging element) makes it possible to perform a global reset that is an operation for collectively resetting a plurality of PDs (light receiving units), and to perform distance measurement with higher precision. However, solid state imaging elements for use in the present disclosure are not limited to the CCD image sensors. With consideration of other requirements as a distance-measuring imaging device, the use of another solid state imaging element (image sensor) such as a CMOS image sensor (CMOS solid state imaging element) also makes it possible to provide the advantageous effect of the present disclosure.

Furthermore, the present disclosure is applicable not only to distance-measuring imaging devices for measuring distances based on distance information, but also to, for example, physical amount detecting devices for detecting (measuring) other physical amounts (for example, shapes, temperatures, irradiation intensities, etc.) with high precision and imaging devices for projecting imaged data with high precision.

The herein disclosed subject matter is to be considered descriptive and illustrative only, and the appended Claims are of a scope intended to cover and encompass not only the particular embodiments disclosed, but also equivalent structures, methods, and/or uses.

INDUSTRIAL APPLICABILITY

The distance-measuring devices and the solid state imaging elements according to one or more exemplary embodiments disclosed herein are capable of enabling three-dimensional measurement of a target object with high precision without depending on a surrounding environment, and therefore are valid for increasing precision in three-dimensional measurement of people, buildings, etc.

The invention claimed is:

1. A distance-measuring imaging device comprising:
a drive control unit configured to generate a light emission control signal instructing light emission and an exposure control signal instructing exposure;
a light source unit configured to perform the light emission upon receiving the light emission control signal;
an imaging unit configured to obtain imaging information by performing, upon receiving the exposure control signal, the exposure to light reflected from a target object in response to the light emission; and
an image processing unit configured to output distance information using the imaging information, the distance information indicating a distance to the target object,
wherein the imaging unit includes:
a plurality of light receiving units configured to generate charge by the exposure; and
a plurality of charge reading units arranged one-to-one with the plurality of light receiving units, and configured to read the charge generated by the plurality of light receiving units, a part of the plurality of charge reading units being arranged at a left side of corresponding ones of the plurality of light receiving units, a remaining part of the plurality of charge reading units being arranged at a right side of corresponding ones of the plurality of light receiving units, and
wherein in each of (i) a first exposure period in which the exposure is performed when the exposure control signal is received after a lapse of a first delay time, since a time when the light emission control signal is received by the light source unit and (ii) a second exposure period in which the exposure is performed when the exposure control signal is received after a lapse of a second delay time longer than the first delay time, since a time when the light emission control signal is received by the light source unit,
the part of the plurality of charge reading units are configured to read charge leftward, the charge being generated by the corresponding ones of the plurality of light receiving units, and
the remaining part of the plurality of charge reading units read charge rightward, the charge being generated by the corresponding ones of the plurality of light receiving units.

2. The distance-measuring imaging element according to claim 1,
wherein the image processing unit includes:
a shading component detecting unit configured to detect, for each of segments of an imaging area and using the imaging information, a shading component which is a variation of the distance information in the imaging area including the plurality of light receiving units and the plurality of charge reading units in the imaging unit;
a lookup table for storing the shading component for each of the segments detected by the shading component detecting unit; and
a correcting unit configured to correct the imaging area shading of the distance information, based on the shading component for each of the segments stored in the lookup table.

3. A solid state imaging element for use in a distance-measuring imaging device,
the distance-measuring imaging device including:
a drive control unit configured to generate a light emission control signal instructing light emission and an exposure control signal instructing exposure;
a light source unit configured to perform the light emission upon receiving the light emission control signal;
an image processing unit configured to output distance information using the imaging information obtained by the solid state imaging element, the distance information indicating a distance to a target object,
the solid state imaging device:
obtaining the imaging information by performing, upon receiving the exposure control signal, the exposure to light reflected from a target object in response to the light emission; and
comprising:
a plurality of light receiving units configured to generate charge by the exposure; and
a plurality of charge reading units arranged one-to-one with the plurality of light receiving units, and configured to read the charge generated by the plurality of light receiving units, a part of the plurality of charge reading units being arranged at a left side of corresponding ones of the plurality of light receiving units, a remaining part of the plurality of charge reading units being arranged at a right side of corresponding ones of the plurality of light receiving units, and
wherein in each of (i) a first exposure period in which the exposure is performed when the exposure control signal is received after a lapse of a first delay time since a time when the light emission control signal is received by the light source unit and (ii) a second exposure period in which the exposure is performed when the exposure control signal is received after a lapse of a second delay time longer than the first delay time, since a time when the light emission control signal is received by the light source unit,
the part of the plurality of charge reading units are configured to read charge leftward, the charge being generated by the corresponding ones of the plurality of light receiving units, and
the remaining part of the plurality of charge reading units read charge rightward, the charge being generated by the corresponding ones of the plurality of light receiving units.

4. The solid state imaging device according to claim 3,
wherein the imaging unit further includes a plurality of bonding pads, and the plurality of bonding pads are for receiving the exposure control signal and are arranged at least at positions opposite to each other above and below an imaging area, the imaging area including the plurality of light receiving units and the plurality of charge reading units.

5. The solid state imaging element according to claim 3,
wherein the solid state imaging element is a solid state imaging element that is a charge coupled device (CCD), and
the exposure control signal includes a substrate voltage for causing the charge in the plurality of light receiving units to overflow.

6. A solid state imaging element for use in a distance-measuring device, the solid state imaging element comprising:
a plurality of light receiving units provided on a semiconductor substrate and configured to generate charge through exposure;

a plurality of charge reading units arranged one-to-one with the plurality of light receiving units and configured to read the charge generated by the plurality of light receiving units; and a plurality of bonding pads for receiving an exposure control signal instructing the exposure of the plurality of light receiving units, wherein a part of the plurality of charge reading units are arranged at left sides of corresponding ones of the light receiving units, and configured to read charge generated by the corresponding ones of the light receiving units leftward, a remaining part of the plurality of charge reading units are arranged at right sides of corresponding ones of the light receiving units and configured to read charge generated by the corresponding ones of the light receiving units rightward, and the plurality of bonding pads are arranged at least at positions opposite to each other above and below the imaging area, the imaging area including the plurality of light receiving units and the plurality of charge reading units.

7. The solid state imaging element according to claim 6, wherein the plurality of light receiving units are arranged in a matrix, and the part of the light receiving units whose charge is read leftward and the remaining part of the light receiving units whose charge is read rightward are arranged alternately in a column direction and in a row direction.

8. The solid state imaging element according to claim 6, wherein the solid state imaging element is a solid state imaging element that is a charge coupled device (CCD), and the exposure control signal includes a substrate voltage for causing the charge in the plurality of light receiving units to overflow.

9. The solid state imaging element according to claim 6, wherein the plurality of light receiving units are arranged in a matrix, and odd-line light receiving elements and even-line light receiving elements among the plurality of light receiving units have different exposure times and different reading times.

\* \* \* \* \*